United States Patent
Xiong et al.

(10) Patent No.: US 10,553,339 B1
(45) Date of Patent: Feb. 4, 2020

(54) COMMON-MODE CHOKE WITH INTEGRATED RF INDUCTOR WINDING

(71) Applicant: UNIVERSAL LIGHTING TECHNOLOGIES, INC., Madison, AL (US)

(72) Inventors: Wei Xiong, Madison, AL (US); Donald Folker, Madison, AL (US); Mike LeBlanc, Huntsville, AL (US); Dane Sutherland, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 0 days.

(21) Appl. No.: 16/268,823

(22) Filed: Feb. 6, 2019

Related U.S. Application Data

(60) Provisional application No. 62/650,335, filed on Mar. 30, 2018.

(51) Int. Cl.
| | | |
|---|---|---|
| *H01F 17/04* | (2006.01) | |
| *H01F 17/06* | (2006.01) | |
| *H01F 27/02* | (2006.01) | |
| *H01F 27/08* | (2006.01) | |
| *H01F 27/24* | (2006.01) | |
| *H01F 27/28* | (2006.01) | |

(Continued)

(52) U.S. Cl.
CPC ......... *H01F 17/04* (2013.01); *H01F 17/0006* (2013.01); *H05K 1/165* (2013.01); *H05K 1/18* (2013.01); *H01F 2017/0093* (2013.01); *H05K 2201/09063* (2013.01); *H05K 2201/09072* (2013.01)

(58) Field of Classification Search
CPC .......... H01F 17/04; H01F 17/06; H01F 27/02; H01F 27/08; H01F 27/24; H01F 27/28; H01F 27/29; H01F 27/30; H01F 27/32; H01F 27/34
USPC ........ 174/260; 363/39, 71, 34, 21.01, 21.02, 363/21.04; 323/250, 351; 336/57, 59, 336/83, 175, 181, 182, 192, 196, 198, 336/208, 221, 212
See application file for complete search history.

(56) References Cited

U.S. PATENT DOCUMENTS

| | | | |
|---|---|---|---|
| 2,561,855 A | 7/1951 | Gould | |
| 4,044,458 A * | 8/1977 | Prince, Jr. ............... | H01F 27/40 29/605 |

(Continued)

*Primary Examiner* — Xiaoliang Chen
(74) *Attorney, Agent, or Firm* — Patterson Intellectual Property Law, P.C.; Gary L. Montle; Jerry Turner Sewell

(57) ABSTRACT

A combination of a common-mode choke and two integrated RF inductors includes first and second E-core. At least one E-core includes first and second protrusions extending from a body portion. Each protrusion is configured to accommodate a respective winding. In a first embodiment, each protrusion extends from the body portion at an angle perpendicular to legs extending from the body portion. In a second embodiment, each protrusion extends from the body portion in an opposite direction from the legs extending from the body portion, and each protrusion includes a respective channel to receive a respective winding. In a third embodiment, each protrusion extends from the body portion in an opposite direction from the legs extending from the body portion, and each protrusion is sized and shaped to extend into a respective opening in a printed circuit board. Each opening is surrounded by a respective printed circuit winding.

5 Claims, 17 Drawing Sheets

(51) Int. Cl.
*H01F 27/29* (2006.01)
*H01F 27/30* (2006.01)
*H01F 27/32* (2006.01)
*H01F 27/34* (2006.01)
*H05K 1/16* (2006.01)
*H05K 1/18* (2006.01)
*H01F 17/00* (2006.01)

(56) References Cited

U.S. PATENT DOCUMENTS

| | | | |
|---|---|---|---|
| 4,307,334 A * | 12/1981 | Peil | H05B 41/2822 315/219 |
| 4,857,878 A * | 8/1989 | Eng, Jr. | H01F 27/306 336/192 |
| 4,885,445 A * | 12/1989 | Taniguchi | H01F 19/04 219/760 |
| 4,931,761 A | 6/1990 | Kijima | |
| 4,940,921 A * | 7/1990 | Helling | G09F 13/26 315/209 R |
| 5,926,946 A | 7/1999 | Minato et al. | |
| 5,929,734 A | 7/1999 | Weiner | |
| 6,088,249 A * | 7/2000 | Adamson | H01F 38/10 315/209 R |
| 6,370,043 B1 * | 4/2002 | Yasumura | H02M 3/335 363/21.02 |
| 6,388,902 B1 * | 5/2002 | Yasumura | H02M 1/36 363/21.02 |
| 6,411,528 B1 * | 6/2002 | Yasumura | H01F 27/2823 336/170 |
| 6,577,510 B1 * | 6/2003 | Yasumura | H02M 3/3385 363/21.02 |
| 6,687,137 B1 * | 2/2004 | Yasumura | H02M 3/33507 363/21.01 |
| 6,980,077 B1 | 12/2005 | Chandrasekaran et al. | |
| 7,221,252 B1 * | 5/2007 | Chang | H01F 27/306 336/212 |
| 7,423,887 B2 * | 9/2008 | Yasumura | H02M 3/33507 363/21.02 |
| 7,498,921 B1 | 3/2009 | Wang | |
| 7,515,026 B1 * | 4/2009 | Liu | H01F 27/29 336/192 |
| 7,646,281 B2 | 1/2010 | Diekmann et al. | |
| 8,031,042 B2 | 10/2011 | Silva | |
| 9,183,974 B1 * | 11/2015 | Folker | H01F 27/306 |
| 9,396,865 B1 | 7/2016 | Folker et al. | |
| 9,837,194 B1 | 12/2017 | Folker et al. | |
| 2001/0036091 A1 * | 11/2001 | Yasumura | H02M 3/3385 363/21.02 |
| 2002/0021575 A1 * | 2/2002 | Yasumura | H02M 3/33569 363/21.04 |
| 2002/0057178 A1 | 5/2002 | Timashov et al. | |
| 2002/0089863 A1 * | 7/2002 | Yasumura | H02M 1/40 363/21.14 |
| 2002/0145497 A1 * | 10/2002 | Yeh | H01F 27/324 336/208 |
| 2002/0145498 A1 * | 10/2002 | Yeh | H01F 27/325 336/208 |
| 2003/0030534 A1 * | 2/2003 | Gu | H01F 27/367 336/221 |
| 2004/0113739 A1 | 6/2004 | Du et al. | |
| 2004/0183448 A1 * | 9/2004 | Hsueh | H01F 27/326 315/57 |
| 2004/0257190 A1 | 12/2004 | Peck et al. | |
| 2005/0093484 A1 * | 5/2005 | Ball | H05B 41/2827 315/291 |
| 2005/0212637 A1 * | 9/2005 | Hsueh | H01F 27/306 336/182 |
| 2005/0270805 A1 * | 12/2005 | Yasumura | H02M 3/3376 363/16 |
| 2006/0227576 A1 * | 10/2006 | Yasumura | H02M 3/335 363/21.02 |
| 2007/0052513 A1 * | 3/2007 | Chang | H01F 27/266 336/212 |
| 2007/0090709 A1 * | 4/2007 | Kanno | H01F 29/14 310/156.26 |
| 2007/0139152 A1 * | 6/2007 | Chan | H01F 27/326 336/208 |
| 2007/0152599 A1 * | 7/2007 | Chan | H01F 27/326 315/82 |
| 2007/0195560 A1 * | 8/2007 | Yasumura | G05F 1/70 363/21.01 |
| 2007/0216508 A1 * | 9/2007 | Ger | H01F 38/10 336/198 |
| 2008/0024261 A1 * | 1/2008 | Shinmen | H01F 27/326 336/208 |
| 2008/0297300 A1 | 12/2008 | Ackermann et al. | |
| 2009/0151153 A1 * | 6/2009 | Liu | H01F 27/29 29/605 |
| 2009/0153280 A1 * | 6/2009 | Chen | H01F 27/29 336/192 |
| 2010/0019875 A1 * | 1/2010 | Ger | H01F 3/10 336/220 |
| 2010/0026437 A1 | 2/2010 | Lin et al. | |
| 2010/0026445 A1 * | 2/2010 | Lin | H01F 27/266 336/84 R |
| 2010/0214053 A1 * | 8/2010 | Chen | H01F 27/325 336/221 |
| 2010/0245009 A1 * | 9/2010 | Akiyama | H01F 27/326 336/175 |
| 2010/0271164 A1 * | 10/2010 | Kitajima | H01F 3/10 336/221 |
| 2011/0037554 A1 * | 2/2011 | Tsai | H01F 27/06 336/196 |
| 2011/0102119 A1 * | 5/2011 | Tsai | H01F 27/324 336/192 |
| 2011/0260820 A1 * | 10/2011 | Liao | H01F 27/325 336/192 |
| 2014/0009251 A1 * | 1/2014 | Hsu | H01F 27/085 336/57 |
| 2015/0302978 A1 * | 10/2015 | Yang | H01F 27/303 336/208 |
| 2015/0302979 A1 * | 10/2015 | Yang | H01F 27/325 336/59 |
| 2016/0133379 A1 * | 5/2016 | Lin | H01F 27/303 336/198 |
| 2016/0315555 A1 * | 10/2016 | Hsiao | H02M 7/08 |
| 2016/0336111 A1 * | 11/2016 | Li | H01F 5/04 |
| 2017/0278622 A1 * | 9/2017 | Chen | H01F 27/30 |
| 2018/0069485 A1 * | 3/2018 | Hsiao | H02M 3/33592 |

* cited by examiner

COMMON-MODE CHOKE WITH INTEGRATED RF INDUCTOR WINDING

CROSS-REFERENCE TO RELATED APPLICATION

This application claims the benefit under 35 U.S.C. § 119(e) of U.S. Provisional Application No. 62/650,335, filed Mar. 30, 2018, entitled "Common-mode Choke with Integrated RF Inductor Winding," which is hereby incorporated by reference in its entirety.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

FIELD OF THE INVENTION

The present disclosure relates generally to common-mode chokes and radio frequency (RF) inductors that reduce electromagnetic interference (EMI).

BACKGROUND

Electronic switching power supplies are used to convert alternating current (AC) to direct current (DC) to provide power to electrical circuits and electronic circuits in controls, communications, lighting and numerous other fields. Because switching power supplies operate at switching frequencies that are within regulated frequency bands, the switching power supplies must conform to regulations imposed by the Federal Communications Commission (FCC) to maintain electromagnetic interference (EMI) within acceptable levels. The FCC regulations of EMI generally are directed to conducted emissions and to radiated emissions.

In conventional electronic circuits, the reduction of conducted emissions and the reduction of radiated emissions are accomplished by different components. A typical common-mode choke comprises a first winding and a second winding wound onto a single common core. The common core may comprise two core bodies that are mated to provide a single core. For example, two E-cores may be installed in a single bobbin to provide a single EE core structure. In such a structure, one or more coils are wound around the abutted center legs of the two E-cores. The AC line current from the line connection of an AC source passes through one of the windings, and the AC neutral current from the neutral connection of the AC source passes through the other winding. The two windings are configured to produce a large inductance to common-mode currents passing through the two windings to reduce the common-mode currents and thereby reduce conducted emissions.

A common-mode choke does not effectively control radiated emissions. Thus, a typical electronic circuit with a switching power supply also includes a first RF inductor (bead) in the path between the AC line (hot) connection and the common-mode choke and a second RF inductor in the path between the AC neutral connection and the common-mode choke. A typical RF inductor has a very low inductance and has a very small parasitic winding capacitance. RF inductors are effective for reducing radiated high frequency RF noise in a range of approximately 30 MHz to approximately 300 MHz.

Although RF inductors are effective to reduce to reduce radiate RF noise, the RF inductors add extra cost to the electronic circuit into which the RF inductors are incorporated. Furthermore, the RF inductors require substantial areas on printed circuit boards.

SUMMARY

A need exists for a magnetic component that combines a common-mode choke and an RF inductor into a single component mountable onto a printed circuit board.

One aspect of the embodiments disclosed herein is a combination of a common-mode choke and two RF inductors. The combination includes a first E-core and a second E-core. At least one E-core includes first and second protrusions extending from a body portion. Each protrusion is sized to be positioned within a respective winding. In a first embodiment, each protrusion extends from the body portion at an angle perpendicular to legs extending from the body portion. In a second embodiment, each protrusion extends from the body portion in an opposite direction from the legs extending from the body portion, and each protrusion includes a respective channel to receive a respective winding. In a third embodiment, each protrusion extends from the body portion in an opposite direction from the legs extending from the body portion, and each protrusion is sized and shaped to extend into a respective opening in a printed circuit board. Each opening is surrounded by a respective printed circuit winding.

Another aspect in accordance with the embodiments disclosed herein is an E-core, which comprises a body portion comprising a rectangular parallelepiped having an inner surface, an outer surface, a first side surface, a second side surface, a first lateral surface and a second lateral surface. A first outer leg extends perpendicularly from the inner surface of the body portion at the first side surface. A second outer leg extends perpendicularly from the inner surface of the body portion at the second side surface. A middle leg extends perpendicularly from the inner surface of the body portion at a location between the first outer leg and the second outer leg. A first protrusion extends from a selected surface of the body portion other than the inner surface. The first protrusion is located near the first side surface. A second protrusion extends from the selected surface of the body portion. The second protrusion is located near the second side surface.

In certain embodiments in accordance with this aspect, the selected surface of the body portion is the first lateral surface.

In certain embodiments in accordance with this aspect, the selected surface of the body portion is the outer surface.

In certain embodiments in accordance with this aspect, each of the first protrusion and the second protrusion has a respective lateral surface parallel to the first lateral surface of the body portion; and each of the first protrusion and the second protrusion includes a respective wire-receiving channel extending into the protrusion from the respective lateral surface of the protrusion.

Another aspect in accordance with the embodiments disclosed herein is a common-mode choke with integrated radio frequency (RF) inductors. The common-mode choke with integrated RF inductors comprises a bobbin having a core-receiving passageway, a first choke winding and a second choke winding. Each of the first and second choke windings is wound around the core-receiving passageway. The common-mode choke with integrated RF inductors further comprises first E-core and a second E-core. Each E-core comprises a body portion, a first outer leg, a second outer leg and a middle leg. The middle leg of the first E-core is inserted into a first end of the core-receiving passageway. The middle leg of the second E-core is inserted into a second end of the core-receiving passageway. At least the respective body portion of the first E-core comprises a rectangular parallelepiped having an inner surface, an outer surface, a first side surface, a second side surface, a first lateral surface and a second lateral surface. The first outer leg extends perpendicularly from the inner surface of the body portion at the first side surface. The second outer leg extends perpendicularly from the inner surface of the body portion at the second side surface. The middle leg extends perpendicularly from the inner surface of the body portion at a location between the first outer leg and the second outer leg. A first protrusion extends from a selected surface of the body portion other than the inner surface. The first protrusion is located near the first side surface. A second protrusion extends from the selected surface of the body portion. The second protrusion is located near the second side surface. A first RF inductor winding is positioned around the first protrusion to form a first integrated RF inductor. A second RF inductor winding is positioned around the second protrusion to form a second integrated RF inductor.

In certain embodiments in accordance with this aspect, the selected surface of the body portion of the first E-core is the first lateral surface.

In certain embodiments in accordance with this aspect, the selected surface of the body portion of the first E-core is the outer surface.

In certain embodiments in accordance with this aspect, each of the first protrusion and the second protrusion of the first E-core has a respective lateral surface parallel to the first lateral surface of the body portion. Each of the first protrusion and the second protrusion of the first E-core includes a respective wire-receiving channel extending into the protrusion from the respective lateral surface of the protrusion. At least a portion of the first RF inductor winding positioned around the first protrusion is positioned in the respective wire-receiving channel of the first protrusion. At least a portion of the second RF inductor winding positioned around the second protrusion is positioned in the respective wire-receiving channel of the second protrusion.

In certain embodiments in accordance with this aspect, the common-mode choke with integrated RF inductors further comprises a printed circuit board (PCB). The PCB has an upper surface and a lower surface. A first opening extends through the PCB from the upper surface to the lower surface. The first opening is configured to receive the first protrusion of the first E-core. A second opening extends through the PCB from the upper surface to the lower surface. The second opening is configured to receive the second protrusion of the first E-core. The first RF inductor winding is formed on at least one of the first surface or the second surface of the PCB as a first printed wiring winding surrounding the first opening. The second RF inductor winding is formed on at least one of the first surface or the second surface of the PCB as a second printed wiring winding surrounding the second opening.

Another aspect in accordance with the embodiments disclosed herein is a method of forming a common-mode choke with integrated radio frequency (RF) inductors. The method comprises inserting a middle leg of an E-core into a core-receiving passageway of a bobbin. The middle leg extends in a first direction from a first surface of a body portion of the E-core. The body portion further includes at least a first protrusion and a second protrusion extending in a second direction from a second surface of the body portion. The method further comprises positioning a first common-mode choke winding and a second common-mode choke winding around the core-receiving passageway of the bobbin. The method further comprises positioning a first RF inductor winding around the first protrusion; and positioning a second RF inductor winding around the second protrusion.

In certain embodiments in accordance with this aspect, the second surface is orthogonal to the first surface; and the second direction is perpendicular to the first direction.

In certain embodiments in accordance with this aspect, positioning the first RF inductor winding comprises wrapping a first wire around the first protrusion; and positioning the second RF inductor winding comprises wrapping a second wire around the second protrusion.

In certain embodiments in accordance with this aspect, the second surface is parallel to the first surface; and the second direction is 180 degrees from the first direction.

In certain embodiments in accordance with this aspect, positioning the first RF inductor winding comprises wrapping a first wire around the first protrusion; and positioning the second RF inductor winding comprises wrapping a second wire around the second protrusion.

In certain embodiments in accordance with this aspect, positioning the first RF inductor winding comprises inserting the first protrusion into a first opening in a printed circuit board (PCB). The first opening is surrounded by a first printed circuit winding. Positioning the second RF inductor winding comprises inserting the second protrusion into a second opening in the PCB, the second opening surrounded by a second printed circuit winding.

In certain embodiments in accordance with this aspect, positioning the first RF inductor winding comprises wrapping a first wire around the first protrusion; and positioning the second RF inductor winding comprises wrapping a second wire around the second protrusion.

In certain embodiments in accordance with this aspect, positioning the first RF inductor winding comprises inserting the first protrusion into a first opening in a printed circuit board (PCB), the first opening surrounded by a first printed circuit winding; and positioning the second RF inductor winding comprises inserting the second protrusion into a second opening in the PCB, the second opening surrounded by a second printed circuit winding.

In certain embodiments in accordance with this aspect, the E-core is a first E-core. The method further comprises positioning the middle leg of a second E-core into the core-receiving passageway of the bobbin. The middle leg of the second E-core has an end surface. The end surface of the middle leg of the second E-core is positioned proximate to an end surface of the middle leg of the first E-core within the core-receiving passageway.

BRIEF DESCRIPTIONS OF THE SEVERAL VIEWS OF THE DRAWINGS

DETAILED DESCRIPTION

The following detailed description of embodiments of the present disclosure refers to one or more drawings. Each drawing is provided by way of explanation of the present disclosure and is not a limitation. Those skilled in the art will understand that various modifications and variations can be made to the teachings of the present disclosure without departing from the scope of the disclosure. For instance, features illustrated or described as part of one embodiment can be used with another embodiment to yield a still further embodiment.

The present disclosure is intended to cover such modifications and variations as come within the scope of the appended claims and their equivalents. Other objects, features, and aspects of the present disclosure are disclosed in the following detailed description. One of ordinary skill in the art will understand that the present discussion is a description of exemplary embodiments only and is not intended as limiting the broader aspects of the present disclosure.

In the following description, various dimensional and orientation words, such as height, width, length, longitudinal, horizontal, vertical, up, down, left, right, tall, low profile, and the like, may be used with respect to the illustrated drawings. Such words are used for ease of description with respect to the particular drawings and are not intended to limit the described embodiments to the orientations shown. One of skill in the art will understand that the illustrated embodiments can be oriented at various angles and that the dimensional and orientation words should be considered relative to an implied base plane that would rotate with the embodiment to a revised selected orientation.

Figure 1:
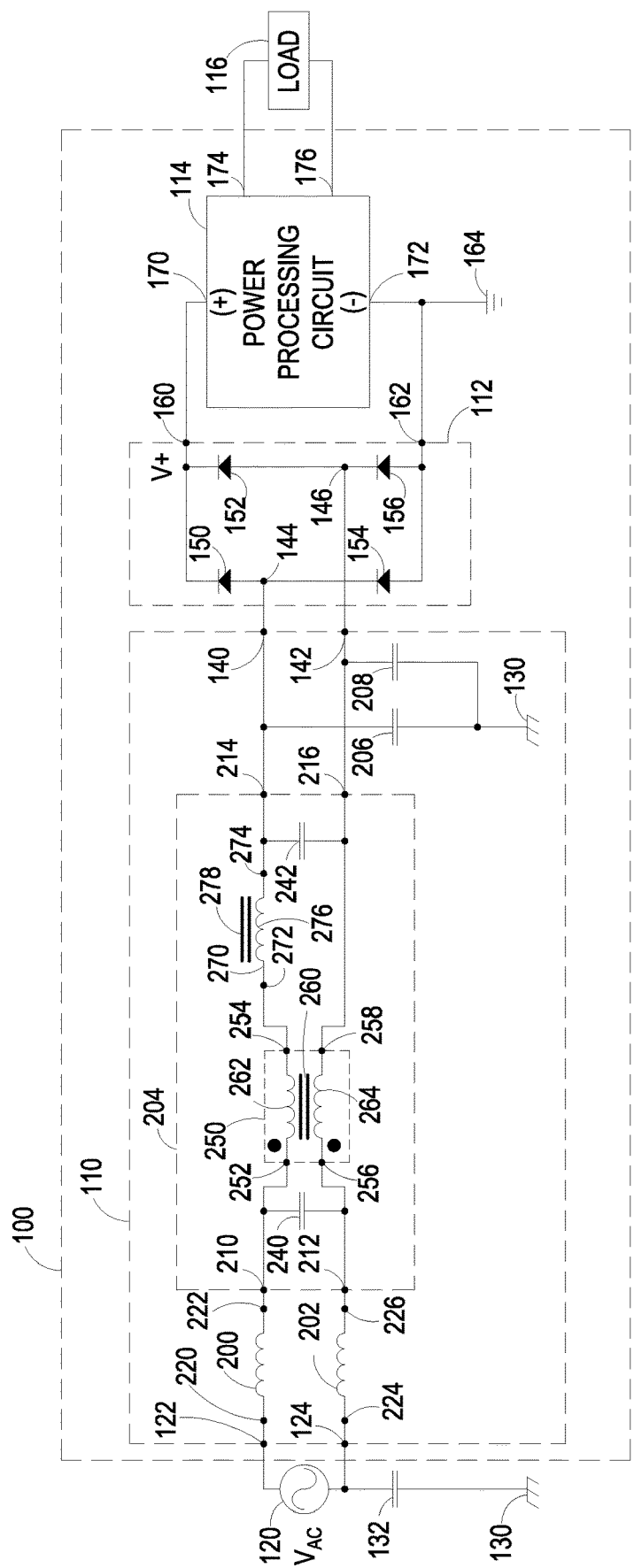
FIG. 1 illustrates a schematic circuit diagram of a topology of a typical conventional electronic switching power supply.

FIG. 1 illustrates a topology of a typical conventional electronic switching power supply 100. The power supply includes three general blocks: an EMI control circuit 110, a rectifier circuit 112, and a power processing circuit 114. The power processing circuit provides power to a DC load 116, which may be, for example, a plurality of interconnected LEDs. AC power from an AC source 120 is provided across a first (line) input 122 and a second (neutral) input 124 of the EMI control circuit. In particular, the line input is connected to a conventional line conductor of the AC source, and the neutral input is connected to a conventional neutral conductor of the AC source. The connections may be accomplished by hardwiring connections to the AC source or by inserting an AC plug into an AC outlet. As further shown in FIG. 1, the AC source is AC-coupled to a local earth ground connection 130 via a first parasitic coupling capacitor 132 representing the capacitive coupling between the line conductor and the neutral conductor to the earth ground conductor in a conventional AC wiring system.

The AC power passes through the EMI control circuit 110 and is provided across a first output terminal 140 and a second output terminal 142 of the EMI control circuit as conditioned AC power. The conditioned AC power across the first output terminal and the second output terminal of the EMI control circuit is provided across a first input terminal 144 and a second input terminal 146 of the rectifier circuit 112. The rectifier circuit is configured as a full-wave bridge rectifier circuit that comprises a first rectifier diode 150, a second rectifier diode 152, a third rectifier diode 154, and a fourth rectifier diode 156, which are connected as shown. The first output terminal of the EMI control circuit is connected to the anode of the first rectifier diode and to the cathode of the third rectifier diode. The second output terminal of the EMI control circuit is connected to the anode of the second rectifier diode and to the cathode of the fourth rectifier diode.

The cathodes of the first rectifier diode 150 and the second rectifier diode 152 are commonly connected to a positive voltage (V+) output terminal 160 of the rectifier circuit 112. The anodes of the third rectifier diode 154 and the fourth rectifier diode 156 are commonly connected to a reference voltage output terminal 162, which is connected to a local circuit ground connection 164. The positive voltage is provided as an unregulated DC voltage to a positive input terminal 170 of the power processing circuit 114. The reference voltage (circuit ground) is provided to a reference voltage (−) input terminal 172 of the power processing circuit.

The power processing circuit 114 operates in a conventional manner to convert the unregulated DC voltage to a regulated voltage or to a regulated current, which is provided to the DC load 116 via a first power processing circuit output terminal 174 and a second power processing circuit output terminal 176. In certain applications, the voltage is controlled to maintain a constant voltage applied to the load. In other applications, such as for example, LED lighting, the current is controlled to maintain a constant current through the load. In the example of FIG. 1, the power processing circuit is a switch-mode power supply, which may also be referred to as an electronic switching power supply. The switch-mode power supply operates by generating a high frequency switched DC signal having a variable duty cycle or a variable pulse width. The duty cycle or pulse width of the switched DC signal is controlled via feedback techniques to generate a selected output voltage (or a selected output current). The high frequency switching generates high frequency noise that should be suppressed to inhibit the noise from being conducted to the AC line and neutral conductors and from being radiated from the power supply 100.

As further shown in FIG. 1, the conventional EMI control circuit 110 comprises a first discrete RF inductor (magnetic bead) 200 and a second discrete RF inductor (magnetic bead) 202, a pi-type filter 204, a first Y-type capacitor 206 and a second Y-type capacitor 208. The pi-type filter has a first filter input node 210, a second filter input node 212, a first filter output node 214 and a second filter output node 216.

The first discrete RF inductor 200 has a first terminal 220 connected to the first (line) input terminal 122 of the EMI control circuit and has a second terminal 222 connected to the first filter input node 210. The second discrete RF inductor 202 has a first terminal 224 connected to the second (neutral) input terminal 124 of the EMI control circuit and has a second terminal 226 connected to the second filter input node 212. The first Y-type capacitor 206 has a first terminal connected to the first filter output node 214 and has a second terminal connected to the local earth ground connection 130. The second Y-type capacitor 208 has a first terminal connected to the second filter output node 216 and has a second terminal connected to the local earth ground connection.

The pi-type filter 204 includes a first X-type capacitor 240 connected between the first filter input node 210 and the second filter input node 212. The pi-type filter also includes a second X-type capacitor 242 connected between the first filter output node 214 and the second filter output node 216.

The pi-type filter 204 includes a common-mode choke 250. The common-mode choke has a first terminal 252, a second terminal 254, a third terminal 256, and a fourth terminal 258. The common-mode choke has a core 260. A first winding 262 is wound onto the core between the first terminal and the second terminal. A second winding 264 is wound onto the core between the third terminal and the fourth terminal.

The second terminal 254 of the common-mode choke 250 is connected to a first terminal 272 of a differential-mode choke 270. The differential-mode choke has a second terminal 274. A single winding 276 is wound onto a core 278 between the first terminal and the second terminal of the differential-mode choke.

The first filter output node 214 is connected to the second terminal 274 of the differential-mode choke 270. The second filter output node 216 is connected directly to the fourth terminal 258 of the common-mode choke 250. As known in the art, the common-mode choke provides a high common-mode impedance with respect to EMI common to the signal lines connected to the line conductor and to the neutral conductor of the AC source 120. The differential-mode choke suppresses differential noise in the power supply 100.

The EMI generated by the high frequency switching within the power processing circuit 114 comprises two types of emissions that appear on the lines leading back to the AC source 120: conducted emissions and radiated emissions. The conducted emissions include common-mode emissions that have similar effects on both the line voltage and the neutral voltage of the AC source and include differential emissions that have differential effects on the line voltage and the neutral voltage.

The first Y-type capacitor 206 and the second Y-type capacitor 208 bypass a substantial portion of the common-mode noise on the line conductor and the neutral conductor, respectively, to the earth ground connection 130 to substantially reduce the common-mode noise reaching the AC source 120. The pi-type filter 204 operates as a differential noise filter that suppresses the conducted differential emissions. A substantial portion of the differential noise on the line conductor and the neutral conductor is bypassed to the earth ground connection by the first X-type capacitor 240 and the second X-type capacitor 242 and is blocked by the differential-mode choke 270.

The common-mode choke 250 further reduces the common-mode noise reaching the AC source 120. Common-mode noise is also a major contributor to radiated noise emission. The first discrete RF inductor 200 and the second discrete RF inductor 202 are located near the connections to the AC source to suppress radiated emission from reaching the AC source.

Figure 2:
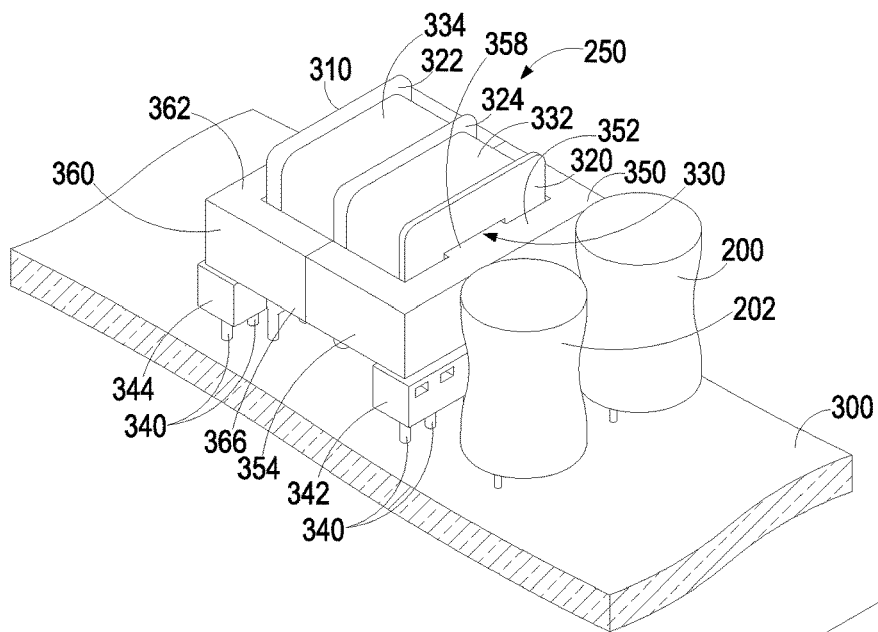
FIG. 2 illustrates a perspective view of a portion of a printed circuit board (PCB) having a common-mode choke and first and second discrete RF inductors mounted thereon.
Figure 4:
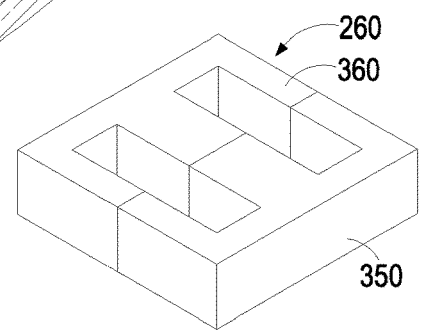
FIG. 4 illustrates a perspective view of the first E-core and the second E-core of FIGS. 2 and 3 with the end surfaces of the legs of the two E-cores abutting to form a combined EE core structure.
Figure 3:
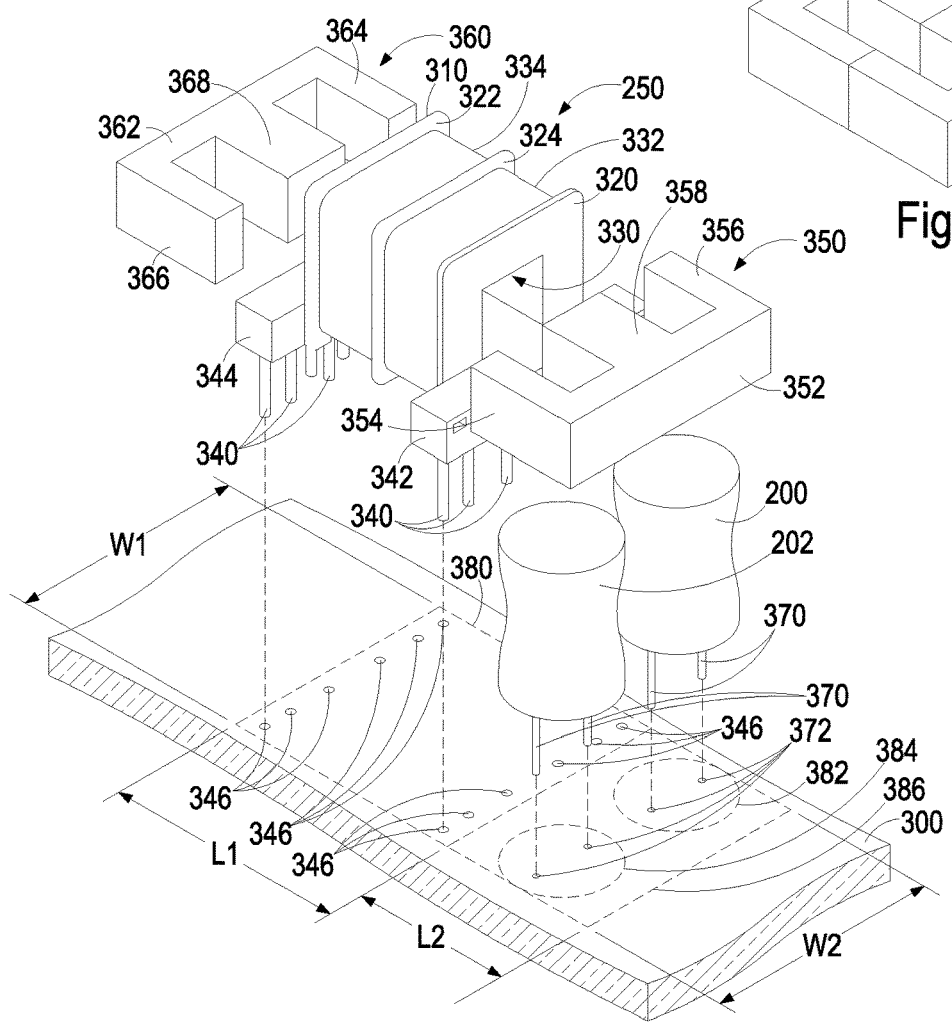
FIG. 3 illustrates an exploded perspective view of the PCB, the common-mode choke and the discrete RF inductors of FIG. 3.
Figure 5:
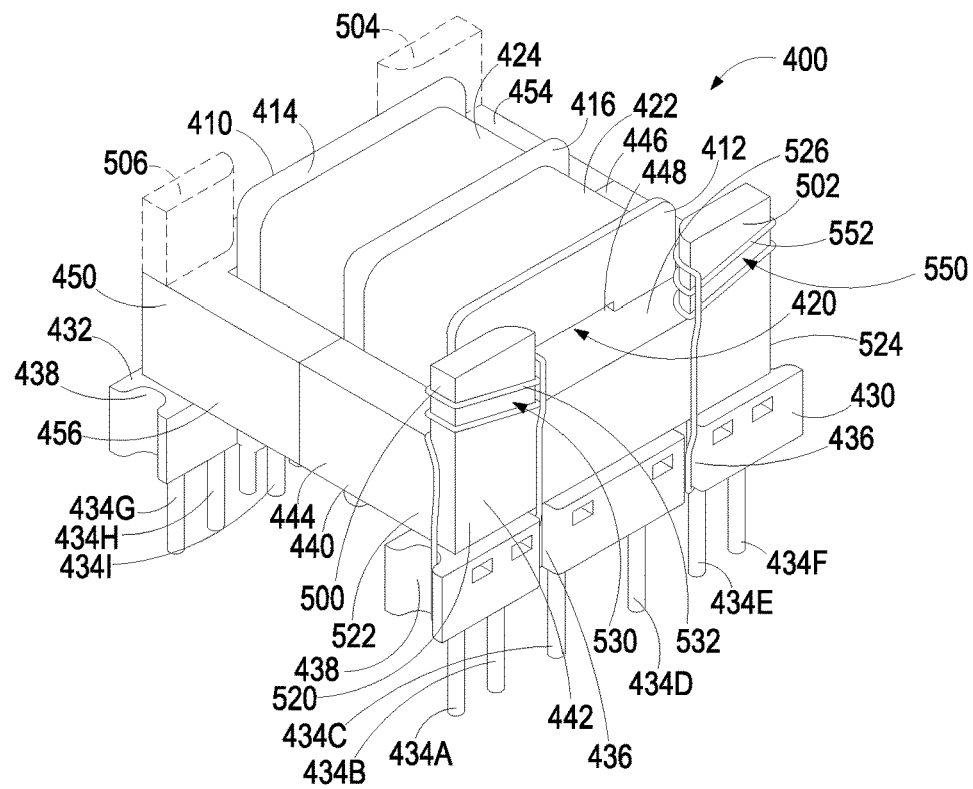
FIG. 5 illustrates a perspective view of a common-mode choke with integrated RF inductors in accordance with a first embodiment in which the integrated RF inductors are formed on protrusions extending vertically from the body portion of at least one E-core.
Figure 6:
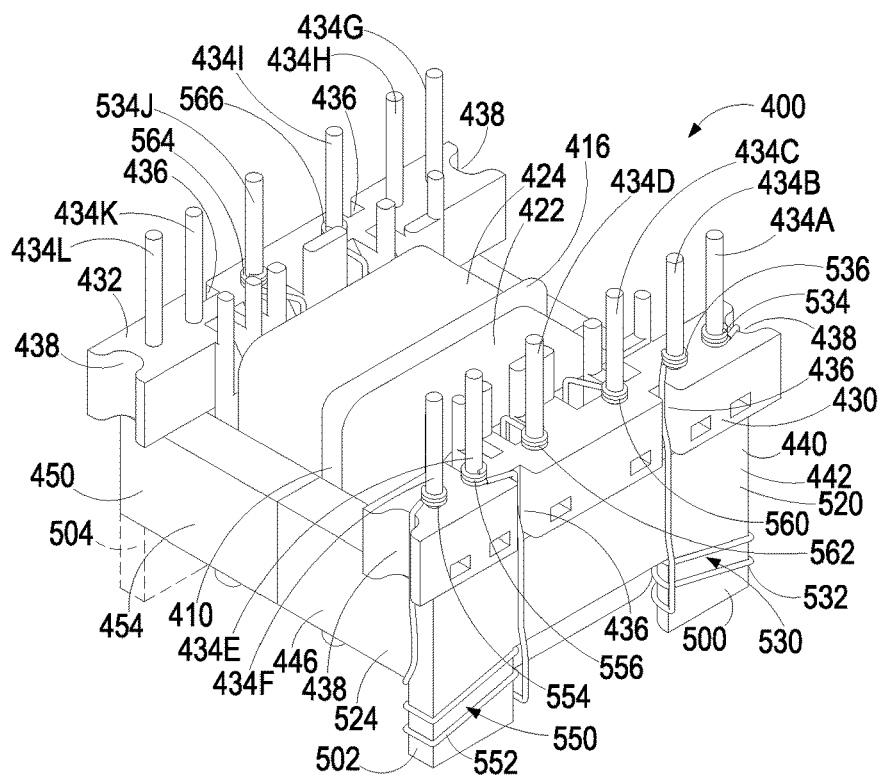
FIG. 6 illustrates a perspective view of the common-mode choke with integrated RF inductors of FIG. 5 rotated 180 degrees about an axis to show the lower structure.

FIG. 2 illustrates a perspective view of a portion of a printed circuit board (PCB) 300 onto which are mounted the common-mode choke 250, the first discrete RF inductor 200 and the second discrete RF inductor 202. FIG. 3 illustrates an exploded perspective view of the components of FIG. 3. FIG. 4 illustrates the core 260 of the common-mode choke, which is an EE core in the illustrated embodiment. The other components illustrated schematically in FIG. 1 are not shown in FIGS. 2 and 3.

The common-mode choke 250 includes a bobbin 310 having a first outer flange 320, a second outer flange 322 and a middle flange 324. A core-receiving passageway 330 extends longitudinally through the bobbin from the first outer flange to the second outer flange. The first winding 262 (FIG. 1) of the common-mode choke is wound as a first coil 332 around the passageway between the first outer flange and the middle flange. The second winding 264 (FIG. 1) of the common-mode choke is wound as a second coil 334 around the passageway between the middle flange and the second outer flange. A plurality of pins 340 (e.g., 12 pins with only 6 pins shown in FIGS. 2 and 3) extend vertically downward from a first pin rail 342 attached to the first outer flange and from a second pin rail 344 attached to the second outer flange. As shown in FIG. 3, the pins are aligned to engage a corresponding plurality of plated holes 346 in the PCB 300. The first winding is electrically connected to a first pair of the pins by respective coil winding ends (not shown) of the first winding. The second winding is electrically connected to a second pair of the pins by respective winding ends (not shown) of the second winding. Additional pins are connected to the printed circuit board but are not electrically connected to the windings.

A first E-core 350 has a respective body portion 352, a respective first outer leg 354, a respective second outer leg 356 and a respective middle leg 358. The middle leg of the first E-core is inserted into the core-receiving passageway 330 of the bobbin 310 at the first outer flange 320. A second E-core 360 has a respective body portion 362, a respective first outer leg 364, a respective second outer leg 366 and a respective middle leg 368. The middle leg of the second E-core is inserted into the core-receiving passageway of the bobbin at the second outer flange 322. The ends of the two middle legs may be abutting or the ends may be spaced apart to form a gap depending on the desired magnetic characteristics of the core structure. Together, the first E-core and the second E-core form the EE core 260 shown in FIG. 4 and represented schematically in FIG. 1. The EE core may also be referred to as an E-E core.

In the illustrated embodiment, each of the discrete RF inductors 200, 202 is generally cylindrical with a diameter of approximately 0.35 inch and a height of approximately 0.5 inch. Each discrete RF inductor has a pair of radial leads 370 extending from a lower surface. The radial leads of each RF inductor are inserted into a corresponding pair of plated holes 372 on the PCB 300.

As represented pictorially in dashed lines on the surface of the PCB 300 in FIG. 3, the common-mode choke 250 occupies a generally rectangular portion 380 of the surface of the PCB. In the illustrated embodiment, the rectangular portion has a length L1 of approximately 0.8 inch and has a width W1 of approximately 0.83 inch. Accordingly, the common-mode choke occupies an area of approximately 0.664 square inch on the surface of the PCB. In comparison, each discrete RF inductor 200, 202 occupies a respective circular portion 382, 384 of the surface of the PCB having a diameter of approximately 0.35 inch. As further illustrated in FIG. 3, the two RF inductors occupy an additional rectangular portion 386 of the PCB having a length L2 of at least 0.35 inch and having a width W2 of at least 0.7 inch to accommodate the two inductors without any additional spacing between the components. Accordingly, the two discrete RF inductors occupy a rectangular block having an area of at least approximately 0.245 square inch, which is approximately 40 percent of the area occupied by the common-mode choke. Together, the common-mode choke and the two RF inductors occupy a total area of at least approximately 0.909 square inch on the surface of the PCB. In an actual implementation, the additional area required for the discrete RF inductors will be greater to accommodate spacing between the two discrete RF inductors, spacing between each discrete RF inductor and the common-mode choke, and spacing between each discrete RF inductors and other nearby components. For example, as illustrated in FIG. 3, providing an additional spacing of approximately 0.1 inch around each inductor causes the additional rectangular portion to have dimensions of approximately 0.55 inch by approximately 0.8 inch, which results in an additional area of approximately 0.44 square inch. Eliminating the discrete RF inductors would free up an area of at least 0.245 square inch up to about 0.44 square inch on the PCB that can be used to mount other components. Alternatively, or in addition, eliminating the discrete RF inductors would also allow the overall size of the PCB to be reduced.

Figure 7:
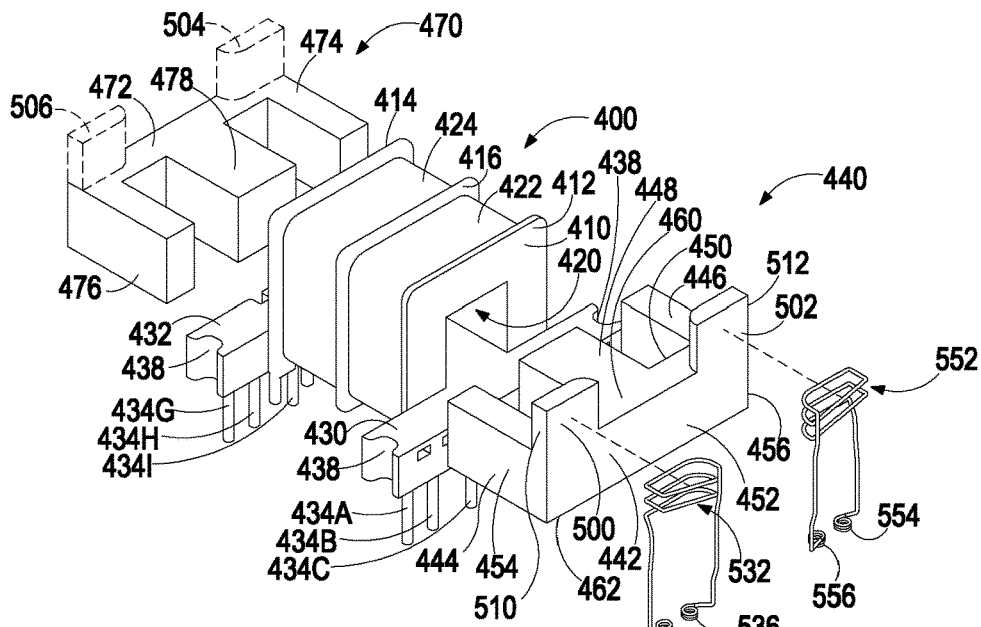
FIG. 7 illustrates an exploded perspective view of the common-mode choke with integrated RF inductors of FIG. 5.
Figure 9:
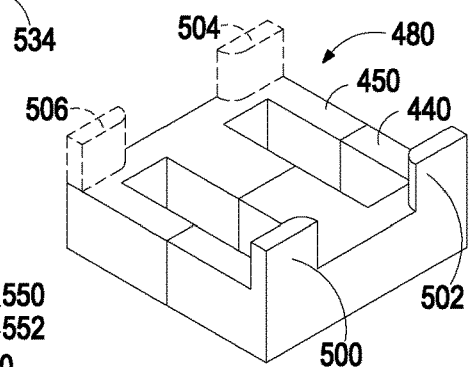
FIG. 9 illustrates a perspective view of the first E-core and the second E-core of FIGS. 5-8 with the end surfaces of the legs of the two E-cores abutting to form a combined EE core structure.
Figure 8:
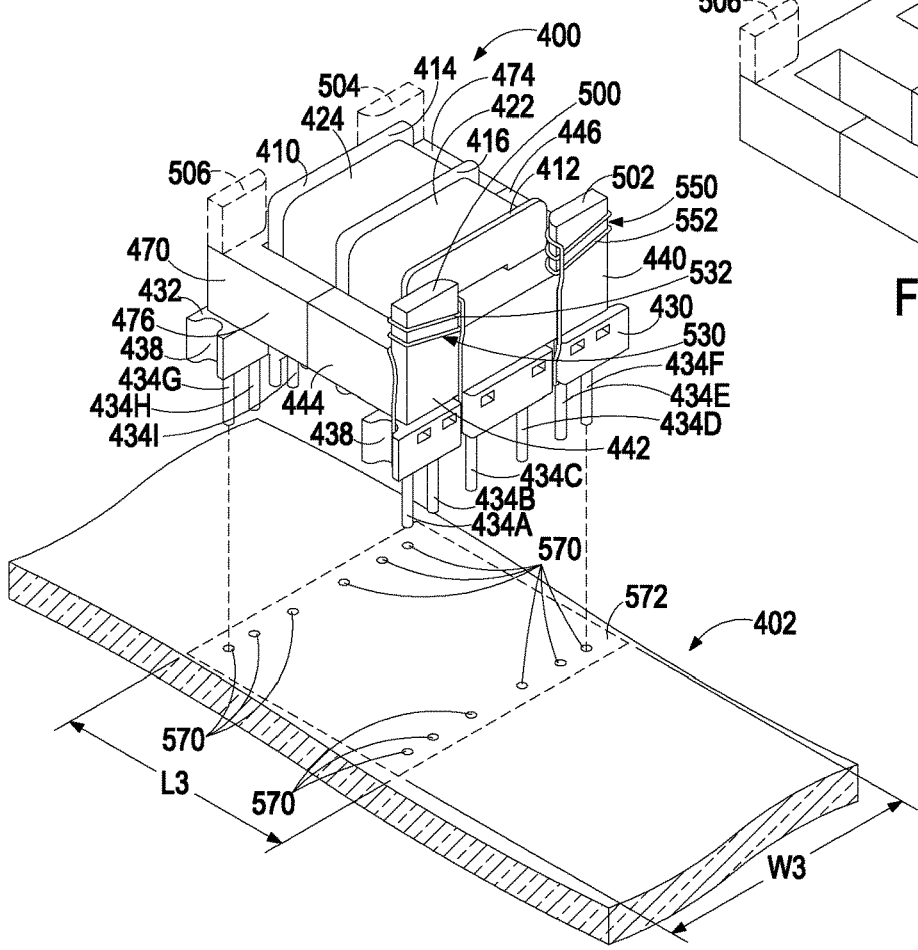
FIG. 8 illustrates the common-mode choke with integrated RF inductors of FIG. 5 positioned to be mounted on a PCB.

FIGS. 5-9 illustrate a first embodiment of a common-mode choke with integrated RF inductors 400 such that the separately installed discrete RF inductors described above are not required. The common-mode choke with integrated RF inductors is mountable on a PCB 402 as shown in FIG. 8.

The common-mode choke with integrated RF inductors 400 of FIGS. 5-9 comprises a bobbin 410 having a first outer flange 412, a second outer flange 414 and a middle flange 416. A core-receiving passageway 420 extends through the bobbin from the first outer flange to the second outer flange. A first coil (winding) 422 is wound around the passageway between the first outer flange and the middle flange. A second coil (winding) 424 is wound around the passageway between the middle flange and the second outer flange. The first coil corresponds to the first winding 262 of the common-mode choke 250 of FIG. 1. The second coil corresponds to the second winding 264 of the common-mode choke of FIG. 1.

A first pin rail 430 extends from the first outer flange 412 of the bobbin 410. A second pin rail 432 extends from the second outer flange 414. A first pin 434A, a second pin 434B, a third pin 434C, a fourth pin 434D, a fifth pin 434E and a sixth pin 434F extend vertically downward from the first pin rail. A seventh pin 434G, an eighth pin 434H, a ninth pin 434I, a tenth pin 434J, an eleventh pin 434K and a twelfth pin 434L extend from the second pin rail. Each pin rail has a pair of end wire guides 436 and a pair of side wire guides 438.

A first E-core 440 has a respective body portion 442, a respective first outer leg 444, a respective second outer leg 446 and a respective middle leg 448. The body portion has an inner surface 450, an outer surface 452, a first side surface 454, a second side surface 456, a first lateral surface (upper surface in the illustrated embodiment) 460 and a second lateral surface (lower surface in the illustrated embodiment) 462. The middle leg of the first E-core is inserted into the core-receiving passageway 420 of the bobbin 410 at the first outer flange 412.

A second E-core 470 has a respective body portion 472, a respective first outer leg 474, a respective second outer leg 476 and a respective middle leg 478 (FIG. 7). The middle leg of the second E-core is inserted into the core-receiving passageway of the bobbin 410 at the second outer flange 414. The ends of the two middle legs may be abutting or the ends may be spaced apart to form a gap depending on the desired magnetic characteristics of the core structure. Together, the first E-core and the second E-core form a combined EE core 480 shown in FIG. 9 and represented schematically in FIGS. 10 and 11. The combined EE core 480, the bobbin 410, the first coil 422 and the second coil 424 form a common-mode choke 490 (FIGS. 10 and 11) that is functionally similar to the previously described common-mode choke 250 of FIGS. 2 and 3.

Unlike the previously described E-cores 350, 360 of FIG. 2, the first E-core 440 in FIGS. 5-9 includes a respective first protrusion 500 and a respective second protrusion 502. The two protrusions extend vertically upward from the first (upper) lateral surface 460 of the body portion 442. In the illustrated embodiment, the second E-core 470 also includes a respective first protrusion 504 and a respective second protrusion 506, which extend vertically upward from the respective body portion 472. The optional protrusions on the second E-core are not used in the illustrated embodiment and are shown in dashed lines. The second E-core may be replaced with a conventional E-core such as one of the E-cores 350, 360 illustrated in FIGS. 2 and 3.

In the illustrated embodiment, the first protrusion 500 of the first E-core 440 is located on the first (upper) lateral surface 460 proximate to a first corner of the body portion 442 defined by the outer surface 452 and the first side surface 454. The first protrusion has a side surface 510 that is coplanar with the first side surface 454 of the body portion. The second protrusion 502 of the first E-core is located on the first lateral surface proximate to a second corner of the body portion defined by the outer surface and the second side surface 456. The second protrusion has a side surface 512 that is coplanar with the second side surface of the body portion. Each protrusion extends upward from the first lateral surface of the body portion for approximately 0.16 inch. Each protrusion extends inward from the outer surface of the body portion for approximately 0.16 inch. Each protrusion extends inward from the respective side surface of the body portion for approximately 0.2 inch. Each protrusion is generally rectangular; however, in the illustrated embodiment, the two surfaces away from the outer surface and away from the side surface are filleted as shown with a radius of approximately 0.05 inch to form an arcuate surface. In the illustrated embodiments, the side surfaces of the protrusions are coplanar with the respective side surfaces of the body portion; however, in other embodiments, each protrusion may be displaced inward from the respective side surface of the body portion.

A first integrated RF inductor 530 comprises a first integrated RF inductor winding 532, which is wound around the first protrusion 500. The first inductor winding comprises approximately 2.5 turns of wire between a respective first winding end 534 and a respective second winding end 536. Each turn is spaced apart from one or more adjacent turns by a distance in a range of approximately 0.03 inch to approximately 0.1 inch to reduce the parasitic capacitance between adjacent turns. The first winding end of the first winding is connected to the first pin 434A extending from the first pin rail 430 of the bobbin 410. The second winding end of the first winding is connected to the second pin 434B extending from the first pin rail. The first end of the first winding is routed to the first pin via a selected side wire guide 438 located nearest the first pin. The second end of the first winding is routed to the second pin via a selected end wire guide 436 located nearest the second pin. The first integrated RF inductor formed by the first inductor winding on the first protrusion replaces the first discrete RF inductor 200 in FIG. 1.

A second integrated RF inductor 550 comprises a second integrated RF inductor winding 552, which is wound around the second protrusion 502. The second inductor winding comprises approximately 2.5 turns of wire between a respective first winding end 554 and a respective second winding end 556. Each turn is spaced apart from one or more adjacent turns by a distance in a range of approximately 0.03 inch to approximately 0.1 inch to reduce the parasitic capacitance between adjacent turns. The first winding end of the second winding is connected to the sixth pin 434F extending from the first pin rail 430. The second winding end of the second winding is connected to the fifth pin 434E extending from the first pin rail. The first winding end of the second winding is routed to the sixth pin via a selected side wire guide 438 located nearest the sixth pin. The second winding end of the first winding is routed to the fifth pin via a selected end wire guide 436 located nearest the fifth pin. The second integrated RF inductor formed by the second inductor winding on the second protrusion replaces the second discrete RF inductor 200 in FIG. 1.

In the illustrated embodiment, the third pin 434C is connected to a first winding end 560 of the first coil 422. The fourth pin 434D is connected to a second winding end 562 of the first coil. The tenth pin 434J and the ninth pin 434I are connected to a respective first winding end 564 and a respective second winding end 566 of the second coil 424.

In alternative embodiments, the first protrusion 504 and the second protrusion 506 of the second E-core 470 may also have windings to provide additional integrated RF inductors, which can be connected to the four unused pins 434G, 434H, 434K, 434L extending from the second pin rail 432.

As shown in FIG. 8, the common-mode choke with integrated RF inductors 400 is mountable onto the PCB 402 by inserting the plurality of pins 434A-L of the common-mode choke with integrated RF inductors into a corresponding plurality of plated holes 570 in the PCB. When the common-mode choke with integrated RF inductors is installed on the PCB, the common-mode choke occupies a generally rectangular portion 572 of the surface of the PCB having a length L3 of approximately 0.829 inch and a width W3 of approximately 0.9 inch. The occupied rectangular portion has an area that is approximately 12.3 percent larger than the area of the rectangular portion 380 of FIG. 3 (e.g., approximately 0.746 square inch versus approximately 0.664 square inch). The common-mode choke with integrated RF inductors occupies substantially less area than the combined area of the common-mode choke 250 and the two discrete RF inductors 200, 202 of FIGS. 2 and 3 (e.g., approximately 0.746 square inch versus approximately 0.909 square inch). The PCB surface area occupied by the common-mode choke with integrated RF inductors can be further reduced by reducing the sizes of the side wire guides 438 extending from the first and second pin rails 430, 432. The common-mode choke with integrated RF inductors has the further advantage of reducing the assembly steps by allowing the common-mode choke and the integrated RF inductors to be installed on the PCB in a single assembly step.

Figure 10:
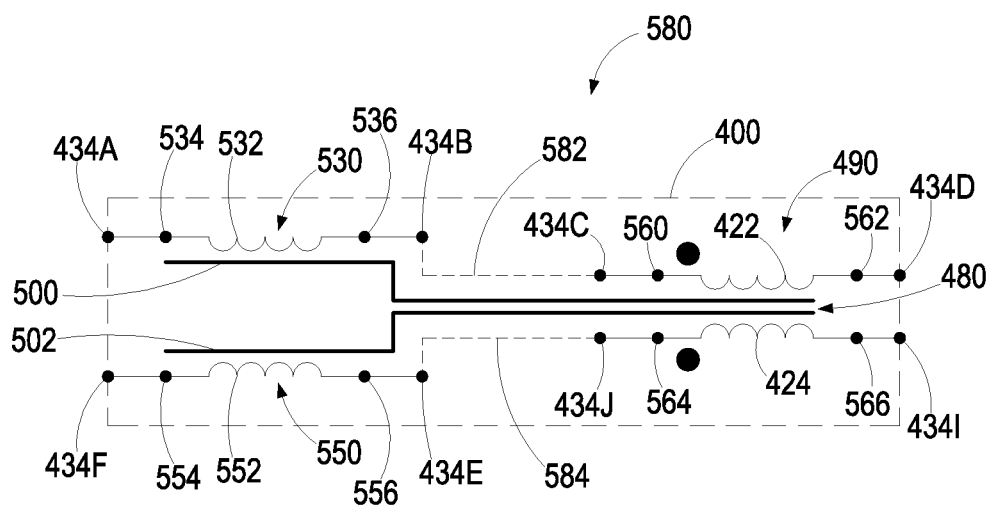
FIG. 10 illustrates a schematic circuit diagram of the common-mode choke with integrated RF inductors of FIGS. 5-8.

The common-mode choke with integrated RF inductors 400 shown in FIGS. 5-9 is represented by a schematic circuit diagram 580 in FIG. 10. In FIG. 10, the first E-core 440 and the second E-core 470 are illustrated by the combined EE core 480. The first protrusion 500 and the second protrusion 502 are represented schematically as extended core portions that extend from the single EE core. The first integrated RF inductor winding 532 and the second integrated RF inductor winding 552 are wound on the protrusions. Although the first and second integrated RF inductor windings are wound on the protrusions that extend from the EE core, the magnetic flux generated by the RF inductor windings on the two protrusions do not have magnetic paths that are common to the magnetic paths through the first coil and the second coil. Thus, although the RF inductor windings are represented as being on a common core as shown in FIG. 10, the magnetic fluxes generated by the RF inductor windings are magnetically isolated from each other and from the magnetic fluxes of the first coil and the second coil.

In FIG. 10, the common-mode choke 490 is formed by the first coil (winding) 422 and the second coil (winding) 424 on the combined EE core 480. The first integrated RF inductor 530 and the second integrated RF inductor 550 are formed on the first protrusion 500 and the second protrusion 502, respectively, of the E-core. The first integrated RF inductor includes the first integrated RF inductor winding 532 wound around the first protrusion. The first winding end 534 of the first inductor winding is connected to the first pin 434A. The second winding end 536 of the first inductor winding is connected to the second pin 434B. The second integrated RF inductor includes the second integrated RF inductor winding 552 wound around the second protrusion. The first winding end 554 of the second inductor winding is connected to the sixth pin 434F. The second winding end 556 of the second inductor winding is connected to the fifth pin 434E.

The first winding end 560 of the first coil 422 of the common-mode choke 490 is connected to the third pin 434C. The second winding end 562 of the first coil is connected to the fourth pin 434D. The first winding end 564 of the second coil 424 of the common-mode choke is connected to the tenth pin 434J. The second winding end 566 of the second coil is connected to the ninth pin 434I.

The second winding end 536 of the first integrated RF inductor winding 532 of the first integrated RF inductor 530 may be connected directly to the first winding end 560 of the first coil 422 by connecting the second pin 434B to the third pin 434C by a first optional wire 582 shown as a dashed connection in FIG. 10. The second winding end 556 of the second inductor winding of the second integrated RF inductor 550 may be connected directly to the first winding end 564 of the second coil 424 by connecting the fifth pin 434E to the tenth pin 434J by a second optional wire 584 shown as a dashed connection in FIG. 10. In the illustrated embodiment, the two optional wires are not used, and the connections between the two integrated RF inductors the common-mode choke are made via printed wiring on the PCB as described below.

Figure 11:
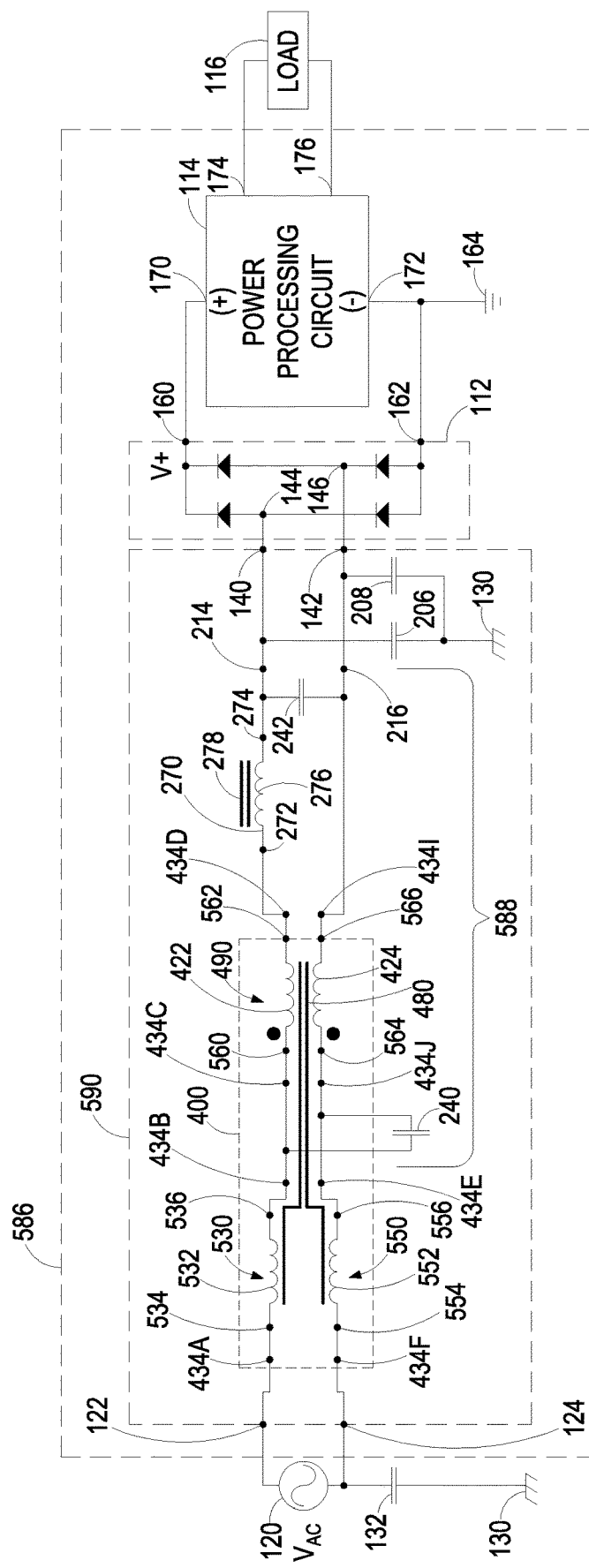
FIG. 11 illustrates a schematic circuit diagram of an electronic switching power supply similar to the electronic power supply of FIG. 1 with the common-mode choke with integrated RF inductors of FIGS. 5-8 replacing the common-mode choke and the discrete RF inductors of FIG. 1.

FIG. 11 illustrates a schematic circuit diagram of an electronic switching power supply 586 that incorporates the common-mode choke with integrated RF inductors 400 of FIGS. 5-9 into a pi-type filter 588 in an EMI control circuit 590, which corresponds electrically to the EMI control circuit 110 of FIG. 1. The components in the EMI control circuit of FIG. 11, other than the components in the common-mode choke with integrated RF inductors and the respective interconnection terminals and pins, are numbered as described above with respect to the EMI control circuit of FIG. 1. The other components in the switching power supply of FIG. 11 correspond to the components in the conventional electronic switching power supply 100 of FIG. 1 and are numbered accordingly.

When the common-mode choke with integrated RF inductors 400 is inserted into the PCB 402 as shown in FIG. 8, the first pin 434A (which is connected to the first winding end 534 of the first integrated RF inductor winding 532 of the first integrated RF inductor 530) is electrically connected via printed wiring on the PCB to the first (line) input terminal 122 of the EMI control circuit 590. The second pin 434B (which is connected to the second winding end 536 of the first inductor winding of the first integrated RF inductor) is electrically connected via printed wiring on the PCB to the third pin 434C to thereby connect the second winding end of the first inductor winding of the first integrated RF inductor to the first winding end 560 of the first coil 422 of the common-mode choke and to the first terminal of the first X-type capacitor 240.

The sixth pin 434F (which is connected to the first winding end 554 of the second integrated RF inductor winding 552 of the second integrated RF inductor 550) is electrically connected via printed wiring on the PCB to the second (neutral) input terminal 124 of the EMI control circuit 590. The fifth pin 434E (which is connected to the second winding end 556 of the second inductor winding of the second integrated RF inductor) is electrically connected via printed wiring on the PCB to the tenth pin 434J to thereby connect the second winding end of the second inductor winding of the second integrated RF inductor to the first winding end 564 of the second coil 424 of the common-mode choke and to the second terminal of the first X-type capacitor 240.

The fourth pin 434D (which is connected to the second winding end 562 of the first coil 422 of the common-mode choke with integrated RF inductors 400) is connected via printed wiring on the PCB to the first terminal 272 of the differential-mode choke 270 as previously described. The ninth pin 434I (which is connected to the second winding end 566 of the second coil 424 of the common-mode choke) is connected via printed wiring on the PCB to the second filter output node 216 to the second terminal of the second X-type capacitor 242 and to the first terminal of the second Y-type capacitor 208.

The first integrated RF inductor 530 and the second integrated RF inductor 550 in the electronic switching power supply 586 of FIG. 11 provide a benefit in the reduction of radiated emissions corresponding to the reduction of radiated emissions provided by the first discrete RF inductor 200 and the second discrete RF inductor 202 in the circuit of FIG. 1. The beneficial effect of the first and second integrated RF inductors is illustrated in FIGS. 12 and 13.

Figure 12:
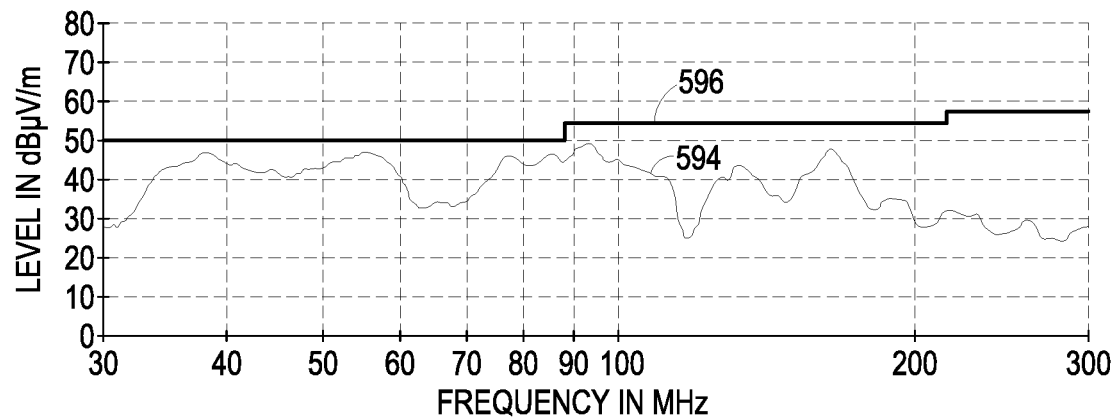
FIG. 12 illustrates an emissions graph of the radiated emissions from an electronic circuit without RF inductors in comparison to a maximum allowable radiated emission in three frequency ranges.

FIG. 12 illustrates a measured emissions graph 594, which represents the measured emissions of a conventional electronic switching power supply similar to the power supply 100 of FIG. 1 but without the discrete RF inductors. The emissions are measured over a frequency range from 30 MHz to 300 MHz. The emission levels are measured in dB-microvolts per meter (dBµV÷m). An emission limits graph 596 represents the maximum allowable measured emissions at 3 meters as specified by the Federal Communications Commission in 47 CFR, Part 15. The maximum allowable measured emission is 50 dBµV÷m in a first frequency range from 30 MHz to 88 MHz. The maximum allowable measured emission is 54 dBµV÷m in a second frequency range from 88 MHz to 216 MHz. The maximum allowable measured emission is 57 dBµV÷m in a third frequency range from 216 MHz to 300 MHz. As illustrated in FIG. 12, the measured emissions of the conventional electronic switching power supply without inductors are lower than the maximum allowable levels over the 30 MHz to 300 MHz range; however, the measured emissions approach the maximum emissions around approximately 38 MHz, around approximately 57 MHz and around approximately 86 MHz.

Figure 13:
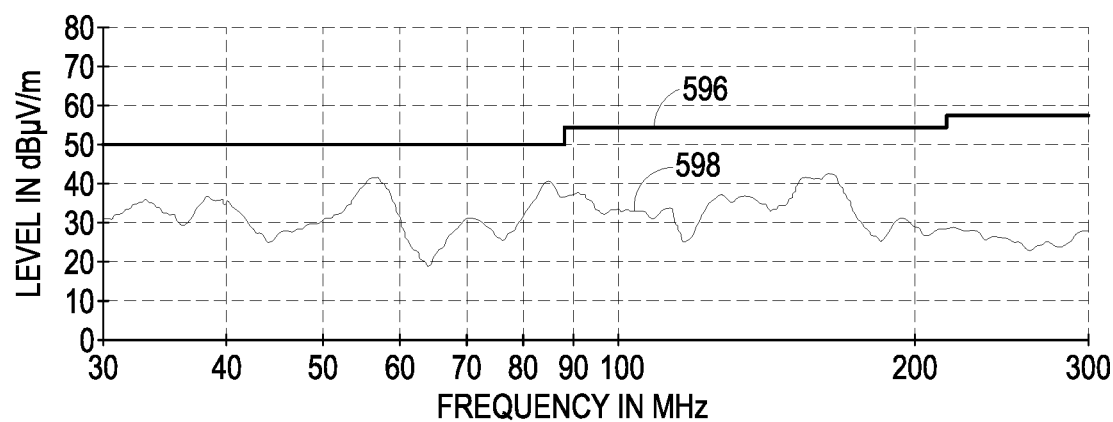
FIG. 13 illustrates an emissions graph of the radiated emissions from the electronic circuit of FIG. 11 with the common-mode choke with integrated RF inductors.
Figure 14:
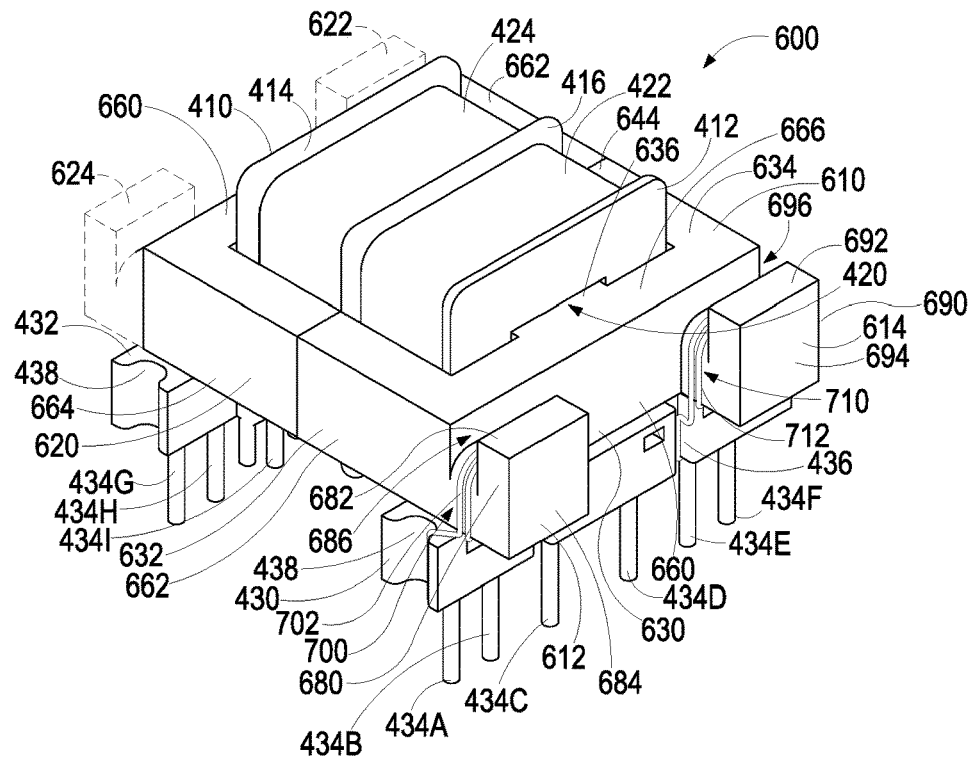
FIG. 14 illustrates a perspective view of a common-mode choke with integrated RF inductors in accordance with a second embodiment in which the integrated RF inductors are formed on protrusions extending horizontally from the body portion of at least one E-core.
Figure 15:
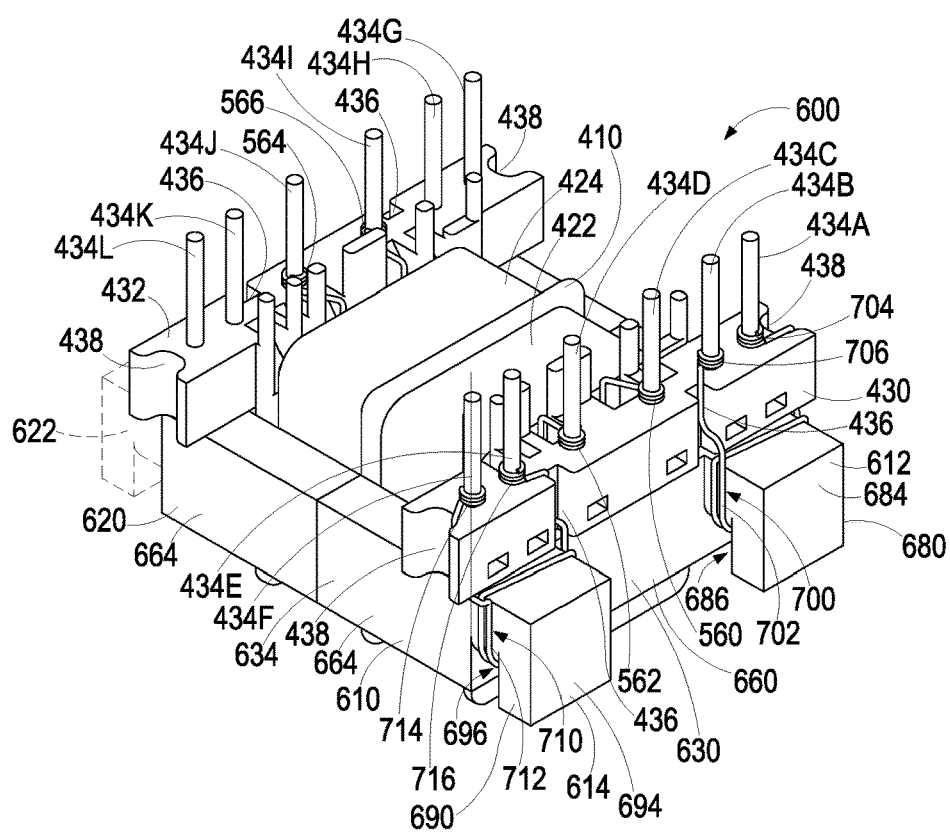
FIG. 15 illustrates a perspective view of the common-mode choke with integrated RF inductors of FIG. 14 rotated 180 degrees about an axis to show the lower structure.

FIG. 13 illustrates a measured emissions graph 598, which represents the measured emissions of the electronic switching power supply 586 of FIG. 11 over the same frequency range from 30 MHz to 300 MHz. The measured emissions graph is shown with respect to the emission limits graph 596. As illustrated in FIG. 13, the measured emission levels for the circuit of FIG. 11 show an improvement of at least 5 dB over the measured frequency range in comparison to the measured emission levels shown in FIG. 12 for the conventional power supply circuit without RF inductors.

Figure 16:
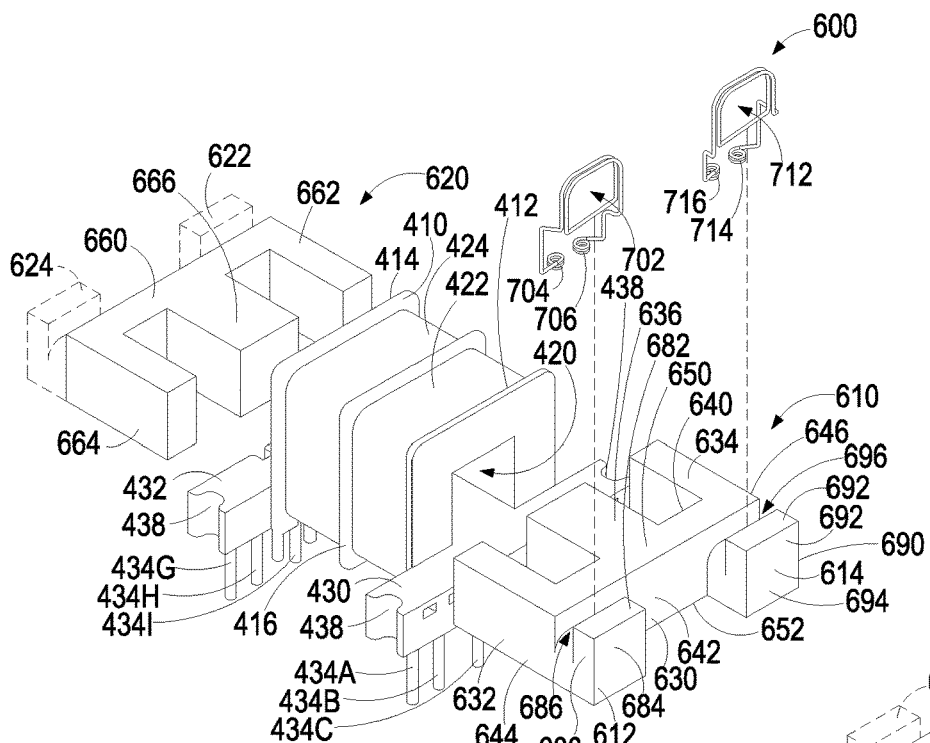
FIG. 16 illustrates an exploded perspective view of the common-mode choke with integrated RF inductors of FIG. 14.
Figure 17:
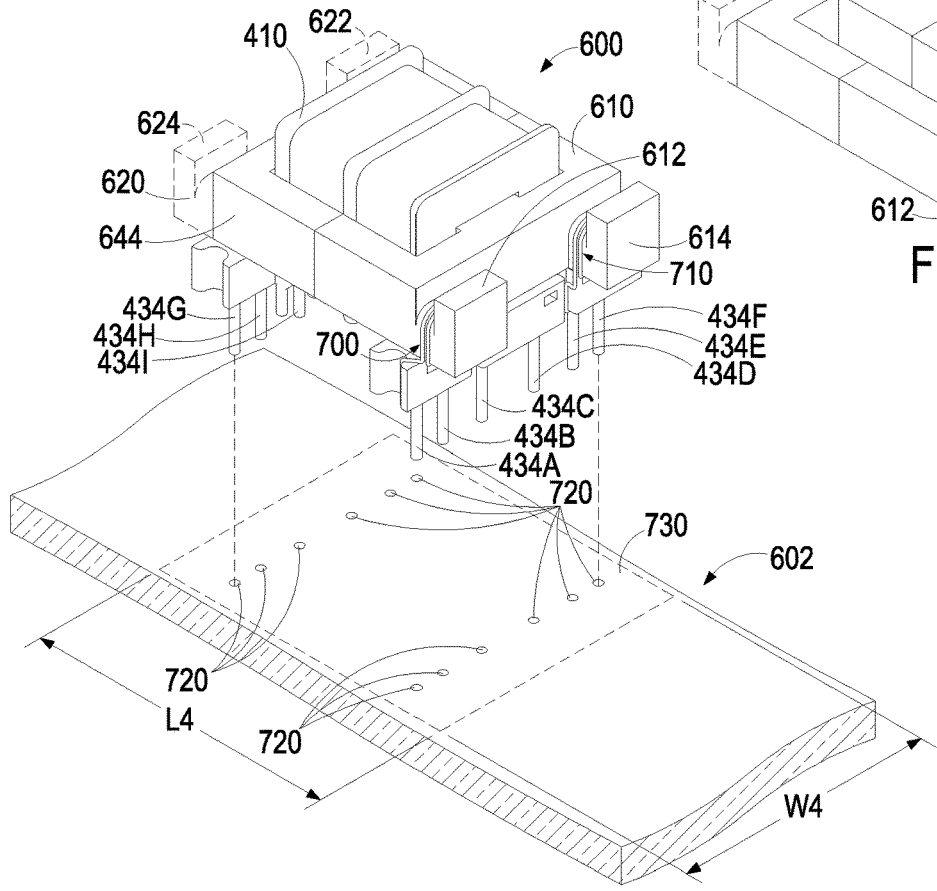
FIG. 17 illustrates the common-mode choke with integrated RF inductors of FIG. 14 positioned to be mounted on a PCB.

FIGS. 14-18 illustrate a further embodiment of a common-mode-choke with integrated RF inductors 600. The embodiment of FIGS. 14-18 is similar to the embodiment of FIGS. 5-9, and like elements are identified with the same element numbers. In the illustrated embodiment, the common-mode-choke with integrated RF inductors of FIGS. 14-18 utilizes the same bobbin 410 as in the embodiment of FIGS. 5-9, and the elements of the bobbin are numbered accordingly. The common-mode choke with integrated RF inductors is mountable on a PCB 602 as shown in FIG. 17.

The common-mode choke with integrated RF inductors 600 of FIGS. 14-18 replaces the previously described first E-core 440 with the vertically extending protrusions 500, 502 with a first E-core 610 having a first horizontally extending protrusion 612 and a second horizontally extending protrusion 614. The second E-core 470 of FIGS. 5-9 may also be replaced with a second E-core 620 with a first horizontally extending protrusion 622 and a second horizontally extending protrusion 624. The protrusions on the second E-core are not used in the embodiment of FIGS. 14-18 and are shown in dashed lines; and the illustrated second E-core may be replaced with the conventional second E-core 360 of FIGS. 2 and 3.

The first E-core 610 includes a body portion 630, a first outer leg 632, a second outer leg 634 and a middle leg 636. The body portion of the first E-core has an inner surface 640, an outer surface 642, a first side surface 644, a second side surface 646, a first lateral surface (upper surface in the illustrated embodiment) 650 and a second lateral surface (lower surface in the illustrated embodiment) 652. The three legs of the first E-core extend from the inner surface as shown.

The second E-core 620 includes a body portion 660, a first outer leg 662, a second outer leg 664 and a middle leg 666 (FIG. 16). The middle legs of the two E-cores are inserted into opposite ends of the core-receiving passageway 420 of the bobbin 410 as described above.

Figure 18:
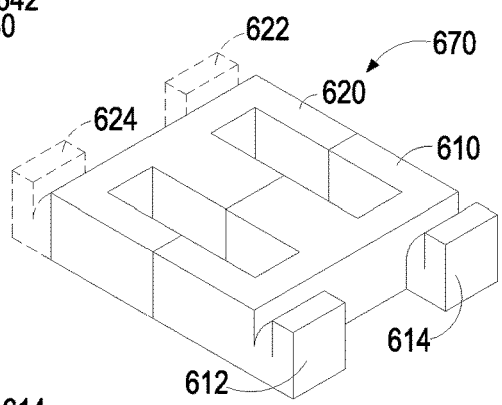
FIG. 18 illustrates a perspective view of the first E-core and the second E-core of FIGS. 14-17 with the end surfaces of the legs of the two E-cores abutting to form a combined EE core structure.
Figure 19:
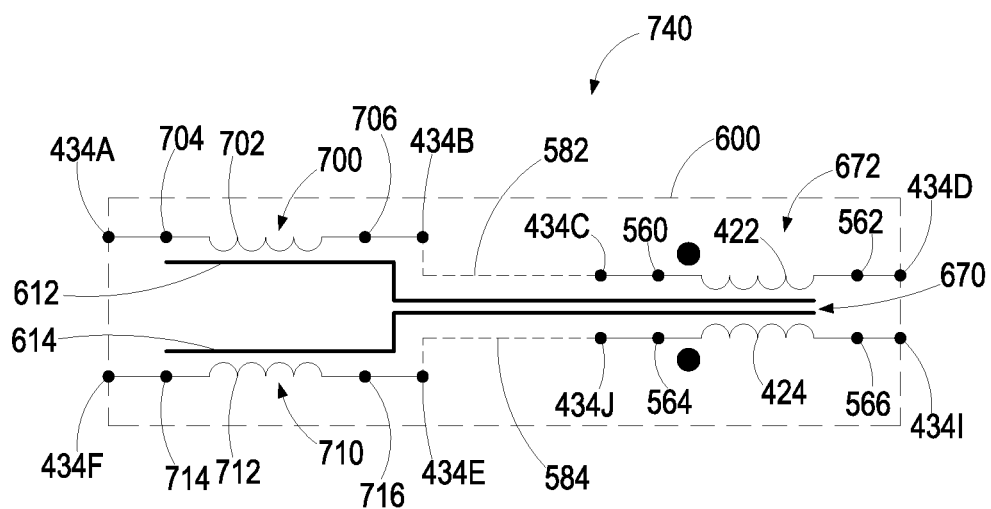
FIG. 19 illustrates a schematic circuit diagram of the common-mode choke with integrated RF inductors of FIGS. 14-17.
Figure 20:
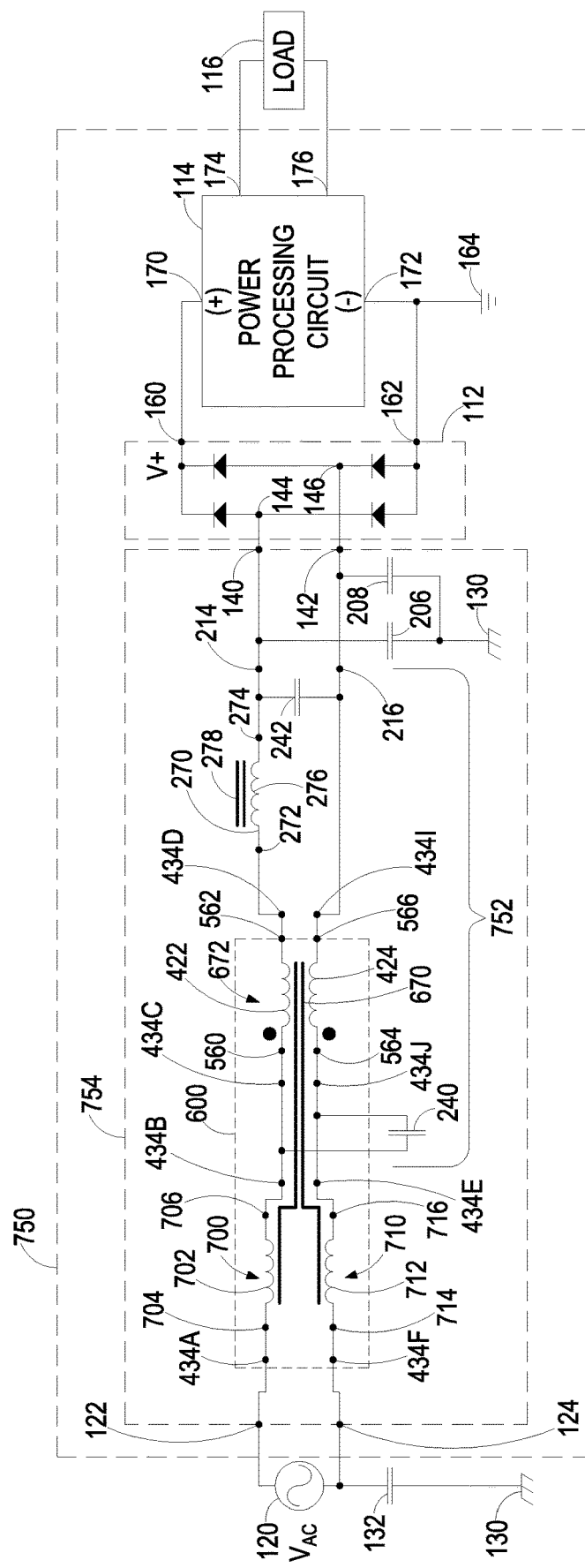
FIG. 20 illustrates a schematic circuit diagram of an electronic switching power supply similar to the electronic power supply of FIG. 1 with the common-mode choke with integrated RF inductors of FIGS. 14-17 replacing the common-mode choke and the discrete RF inductors of FIG. 1.

Together, the first E-core 610 and the second E-core 620 form an EE core 670 shown in FIG. 18 and represented schematically in FIGS. 19 and 20. The EE core 670, the bobbin 410, the first coil 422 and the second coil 424 form a common-mode choke 672 (FIGS. 19 and 20) that is functionally similar to the previously described common-mode choke 250.

The first protrusion 612 of the first E-core 610 extends from a first corner of the outer surface 642 of the body portion 630 defined by the first side surface 644 and the first lateral (upper) surface 650 of the body portion. The first protrusion has a side surface 680, a lateral (upper) surface 682 and an outer surface 684. In the illustrated embodiment, the side surface of the first protrusion is coplanar with the first side surface of the body portion; and the lateral surface is coplanar with the first lateral surface of the body portion. The outer surface of the first protrusion is parallel to and spaced apart from the outer surface of the body portion. The first protrusion extends horizontally approximately 0.2 inch from the side surface along the first lateral surface of the body portion. The first protrusion extends vertically downward approximately 0.222 inch from the first lateral surface of the body portion for a distance that corresponds to the thickness (height) of the body portion in the illustrated embodiment. The first protrusion extends horizontally outward approximately 0.15 inch from the outer surface of the body portion to the outer surface of the protrusion. A channel 686 is formed in the upper surface proximate to the outer surface of the body portion. In the illustrated embodiment, the channel has a horizontal width of approximately 0.07 inch and has a vertical depth of approximately 0.07 inch. In the illustrated embodiment, the ends of the channel are filleted at a radius of approximately 0.05 inch.

The second protrusion 614 of the first E-core 610 extends from a second corner of the outer surface 642 of the body portion 630 defined by the second side surface 646 and the first lateral (upper) surface 650 of the body portion. The second protrusion has dimensions similar to or the same as the first protrusion 612. The second protrusion has a side surface 690, a lateral (upper) surface 692 and an outer surface 694. In the illustrated embodiment, the side surface of the second protrusion is coplanar with the second side surface of the body portion; and the lateral surface is coplanar with the first lateral surface of the body portion. The outer surface of the second protrusion is parallel to and spaced apart from the outer surface of the body portion. A channel 696 is formed in the upper surface of the second protrusion proximate to the outer surface of the body portion. The channel in the second protrusion is configured to have dimensions corresponding to the dimensions of the channel 686 in the first protrusion.

In the illustrated embodiment, the respective side surfaces 680, 690 of the two protrusions 612, 614 are coplanar with the respective side surfaces 644, 646 of the body portion 630 of the first E-core 610. In alternative embodiments, the two protrusions may be displaced inwardly toward the middle of the body portion such that the outer surfaces of the protrusions are not coplanar with the side surfaces of the body portion.

The optional protrusions 622, 624 extending horizontally from the outer surface of the body portion 660 of the second E-core 620 have structures corresponding to the protrusions 612, 614 and are not described further herein.

A first integrated RF inductor 700 comprises a first inductor winding 702, which is wound around the first protrusion 612 and through the channel 686 of the first protrusion. The first inductor winding comprises approximately 1.5 turns of wire between a respective first winding end 704 and a respective second winding end 706. The turns are spaced apart by a distance in a range of approximately 0.03 inch to approximately 0.1 inch to reduce the parasitic capacitance between the turns. The first winding end of the first winding is connected to the first pin 434A extending from the first pin rail 430 of the bobbin 410. The second winding end of the first winding is connected to the second pin 434B extending from the first pin rail. The first winding end of the first winding is routed to the first pin via a selected side wire guide 438 located nearest the first pin. The second winding end of the first winding is routed to the second pin via a selected end wire guide 436 located nearest the second pin. The first integrated RF inductor formed by the first inductor winding on the first protrusion replaces the first discrete RF inductor 200 in FIG. 1.

A second integrated RF inductor 710 comprises a second inductor winding 712, which is wound around the second protrusion 614 and through the channel 696. The second inductor winding comprises approximately 1.5 turns of wire between a respective first winding end 714 and a respective second winding end 716. The turns are spaced apart by a distance in a range of approximately 0.03 inch to approximately 0.1 inch to reduce the parasitic capacitance between adjacent turns. The first winding end of the second winding is connected to the sixth pin 434F extending from the first pin rail 430. The second winding end of the second winding is connected to the fifth pin 434E extending from the first pin rail. The first winding end of the second winding is routed to the sixth pin via a selected side wire guide 438 located nearest the sixth pin. The second winding end of the first winding is routed to the fifth pin via a selected end wire guide 436 located nearest the fifth pin. The second integrated RF inductor formed by the second inductor winding on the second protrusion replaces the second discrete RF inductor 202 in FIG. 1.

As in the embodiment of FIGS. 5-9, in the embodiment of FIGS. 14-18, the third pin 434C is connected to the first winding end 560 of the first coil 422. The fourth pin 434D is connected to the second winding end 562 of the first coil. The tenth pin 434J and the ninth pin 434I are connected to the respective first winding end 564 and the respective second winding end 566 of the second coil 424.

In alternative embodiments, the optional first protrusion 622 and the optional second protrusion 624 of the second E-core 620 may also have windings to provide additional integrated RF inductors, which can be connected to the four unused pins 434G, 434H, 434K, 434L extending from the second pin rail 432.

As shown in FIG. 17, the common-mode choke with integrated RF inductors 600 is mountable onto the PCB 602 by inserting the plurality of pins 434A-L of the common-mode choke with integrated RF inductors into a corresponding plurality of plated holes 720 in the PCB. When the common-mode choke with integrated RF inductors is installed on the PCB, the common-mode choke occupies a generally rectangular portion 730 of the surface of the PCB having a length L4 of approximately 1.08 inch and a width W4 of approximately 0.9 inch. The occupied rectangular portion has an area that is approximately 12.3 percent larger than the area of the rectangular portion 380 of FIG. 3 (e.g., approximately 0.972 square inch versus approximately 0.664 square inch). The common-mode choke with integrated RF inductors occupies a slightly larger area than the combined areas 380, 386 of the common-mode choke 250 and the two discrete RF inductors 200, 202 of FIGS. 2 and 3 (e.g., approximately 0.972 square inch versus approximately 0.909 square inch). The length L4 of the occupied area can be reduced to approximately 0.955 inch by substituting the second E-core 360 without protrusions of FIGS. 2 and 3 for the second E-core 620. This reduction in the length of the area reduces the area to approximately 0.86 square inch, which is less than the combined areas 380, 386 of FIG. 3. The PCB surface area occupied by the common-mode choke with integrated RF inductors can be further reduced by reducing the sizes of the side wire guides 438 extending from the first and second pin rails 430, 432. Even without reducing the area, the common-mode choke with integrated RF inductors reduces the assembly steps by allowing the common-mode choke and the integrated RF inductors to be installed on the PCB in a single assembly step.

The common-mode choke with integrated RF inductors 600 shown in FIGS. 14-18 is represented by a schematic circuit diagram 740 in FIG. 19. As described above, the common-mode choke 672 portion of the common-mode choke with integrated RF inductors is formed by the first coil (winding) 422 and the second coil (winding) 424 on the EE core 670. The first integrated RF inductor 700 and the second integrated RF inductor 710 of the common-mode choke with integrated RF inductors are formed on the first protrusion 612 and the second protrusion 614, respectively, of the EE core 670. Except for the changes in element identifiers, the schematic circuit diagram 740 of the of the common-mode choke with integrated RF inductors in FIG. 19 corresponds to the schematic circuit diagram 580 of the common-mode choke with integrated RF inductors 400 of FIG. 10.

FIG. 20 illustrates a schematic circuit diagram of a switching power supply 750 that incorporates the common-mode choke with integrated RF inductors 600 of FIGS. 14-18 into a pi-type filter 752 in an EMI control circuit 754, which corresponds electrically to the EMI control circuit 110 of FIG. 1. The components in the EMI control circuit of FIG. 20, other than the components in the common-mode choke with integrated RF inductors and the respective interconnection terminals and pins, are numbered as described above with respect to the EMI control circuit of FIG. 1. The other components in the switching power supply of FIG. 20 correspond to the components in the conventional electronic switching power supply 100 of FIG. 1 and are numbered accordingly.

Although the physical structures of the first integrated RF inductor 700 and the second integrated RF inductor 710 of FIGS. 14-18 differ from the previously described integrated RF inductors 530, 550 of FIGS. 5-9, the electrical characteristics are similar. Accordingly, the embodiment of FIGS. 14-18 provides a reduction in the measured emission levels comparable to the reduction illustrated in FIGS. 12 and 13 for the embodiment of FIGS. 5-9.

FIGS. 21-27 illustrate a further embodiment of a common-mode choke with integrated RF inductors 800. The common-mode choke with integrated RF inductors comprises a common-mode choke portion 810 mounted on a PCB 812. The PCB has an upper surface 814 and a lower surface 816. The common-mode choke comprises a bobbin 820 having a first (lower) outer flange 822, a second (upper) outer flange 824 and a middle flange 826. A core-receiving passageway 830 extends between the first outer flange and the second outer flange. In the embodiment of FIGS. 21-27, the core-receiving passageway is oriented perpendicular to the upper surface of the PCB (e.g., vertically in the illustrated orientation of the PCB). The three flanges are oriented parallel to the upper surface of the PCB with the first outer flange closest to the upper surface of the PCB and with the second outer flange farthest from the upper surface of the PCB.

A first winding 840 is wound around the core-receiving passageway 830 between the first outer flange 822 and the middle flange 826. The first winding has a respective first winding end 842 and a respective second winding end 844 shown in FIG. 27. A second winding 850 is wound around the core-receiving passageway between the middle flange and the second outer flange 824. The second winding has a respective first winding end 852 and a respective second winding end 854 shown in FIG. 27.

A first pin rail 860 extends vertically downward from the first outer flange 822. A second pin rail 862 also extends vertically downward from the first outer flange. The two pin rails are separated by the core-receiving passageway. A first pin 864A, a second pin 864B and a third pin 864C extend vertically downward from the first pin rail. A fourth pin 864D, a fifth pin 864E and a sixth pin 864F extend vertically downward from the second pin rail. Two of the pins (e.g., the first pin 864A and the fourth pin 864D) are connected to the first winding end 842 and the second winding end 844, respectively, of the first winding 840. Two of the pins (e.g., the third pin 864C and the sixth pin 864F) are connected to the first winding end 852 and the second winding end 854 of the second winding 850. The PCB 812 includes a plurality of plated holes 866 that are positioned to receive the six pins when the common-mode choke portion 810 is mounted on the PCB.

The common-mode choke with integrated RF inductors 800 further includes a first E-core 880 having a respective body portion 882, a first outer leg 884, a second outer leg 886 and a middle leg 888. The common-mode choke with integrated RF inductors further includes a second E-core 890 having a respective body portion 892, a first outer leg 894, a second outer leg 896 and a middle leg 898. Together, the first E-core and the second E-core form an EE core 900 shown in FIG. 24 and represented schematically in FIGS. 28 and 29. The EE core 900, the bobbin 410, the first coil 422 and the second coil 424 form the common-mode choke portion 810 that is functionally similar to the previously described common-mode choke 250.

The middle leg 888 of the first E-core 880 is inserted into the core-receiving passageway 830 of the bobbin 820 at the first outer flange 822. When the middle leg is fully inserted into the core-receiving passageway, the body portion 882 of the first E-core is positioned in a lower channel 910 of the bobbin between the first pin rail 860 and the second pin rail 862.

The middle leg 898 of the second E-core 890 is inserted into the core-receiving passageway 830 at the second outer flange 824. When the middle leg of the second E-core is fully inserted into the core-receiving passageway, the end of the first outer leg 894 of the second E-core abuts the end of the second outer leg 896 of the first E-core 880. The end of the second outer leg 896 of the second E-core abuts the end of the first outer leg 884 of the first E-core. In the illustrated embodiment, the end of the middle leg of the second E-core abuts the end of the middle leg 888 of the first E-core. In alternative embodiments, the ends of the two middle legs may be spaced apart by a small distance to form a gap. The body portion 892 of the second E-core is positioned in an upper channel 912 of the bobbin 820 between a first upper channel wall 914 and a second upper channel wall 916.

The first E-core 880 has a basic structure similar to the first E-core 350 of FIGS. 2 and 3. The body portion 882 of the first E-core has an inner surface 920, an outer surface 922, a first side surface 924, a second side surface 926, a first lateral surface 930 and a second lateral surface 932, which form a rectangular parallelepiped as previously described.

The first E-core of FIGS. 21-27 further includes a first protrusion 940 and a second protrusion 942. The two protrusions extend perpendicularly from the outer surface 922 of the body portion 882 of the first E-core. When oriented as shown in FIGS. 21-24, the two protrusions extend vertically downward from the body portion. Each protrusion has a respective first (outer) side surface 950, a respective second (inner) side surface 952, a respective first (upper) lateral surface 954, a respective second (lower) lateral surface 956 and a respective end surface 958.

The first protrusion 940 is located near the first side surface 924 of the body portion 882 and is generally aligned with the first outer leg 884 of the first E-core such that the respective first side surface 950 of the first protrusion is coplanar with the first side surface of the body portion, the first lateral surface 954 of the first protrusion is coplanar with the first lateral surface 930 of the body portion, and the second lateral surface 956 of the first protrusion is coplanar with the second lateral surface 932 of the body portion. The end surface 958 of the first protrusion is parallel to and displaced from the outer surface 922 of the body portion.

The second protrusion 942 is located near the second side surface 926 of the body portion 882 and is generally aligned with the second outer leg 886 of the first E-core such that the respective first side surface 950 of the second protrusion is coplanar with the second side surface of the body portion, the first lateral surface 954 of the second protrusion is coplanar with the first lateral surface 930 of the body portion, and the second lateral surface 956 of the second protrusion is coplanar with the second lateral surface 932 of the body portion. The end surface 958 of the second protrusion is parallel to and displaced from the outer surface 922 of the body portion.

In the illustrated embodiment, each protrusion 940, 942 has a respective cross-sectional profile corresponding to the cross-sectional profiles of the first and second outer legs 884, 886, respectively. For example, in the illustrated embodiment, each protrusion has a thickness T of approximately 0.22 inch and a width W of approximately 0.107 inch. Each protrusion extends outward from the outer surface of the body portion for a length L of approximately 0.2 inch.

In alternative embodiments, the two protrusions 940, 942 may have cross-sectional profiles that differ from the cross-sectional profiles of the outer legs 884, 886. The two protrusions may be displaced from the respective side surfaces 924, 926 and from the lateral surfaces 930, 932 of the body portion 882 of the first E-core 880 such that the surfaces of the protrusions are not coplanar with the surfaces of the body portion.

The first protrusion 940 is sized and positioned to fit into a first rectangular opening 960 in the PCB 812, which extends through the PCB from the upper surface 814 to the lower surface 816. The second protrusion 942 is sized and positioned to fit into a second rectangular opening 962 in the PCB, which also extends through the PCB.

The first rectangular opening 960 is surrounded by a first printed circuit winding 970, which is formed on the upper surface 814 in the illustrated embodiment. The first printed circuit winding has a respective first winding end 972 proximate to the first rectangular opening. The first printed circuit winding spirals outward in a counterclockwise direction for approximately 5 turns to a respective second winding end 974.

The second rectangular opening 962 is surrounded by a second printed circuit winding 980, which is formed on the upper surface 814 in the illustrated embodiment. The second printed circuit winding has a respective first winding end 982 proximate to the second rectangular opening. The second printed circuit winding spirals outward in a clockwise direction for approximately 5 turns to a respective second winding end 984.

In alternative embodiments, the two printed circuit windings 970, 980 may have more turns or may have fewer turns. The respective first winding ends 972, 982 and the respective second winding ends 974, 984 of the two printed circuit windings are connected to other circuitry on the PCB 812 as described below via conventional printed circuit wiring techniques.

Although the first printed circuit winding 970 and the second printed circuit winding 980 are shown on the upper surface 814 of the PCB 812 in the illustrated embodiment, the printed circuit windings may also be formed on the lower surface 816 in other embodiments. In still other embodiments, the printed circuit windings may be formed on both the upper surface and the lower surface to effectively increase the number of winding turns without increasing the areas surrounding the first rectangular opening 960 and the second rectangular opening 962.

In the illustrated embodiment, the second E-core 890 is a conventional E-core without protrusions. For example, the second E-core 890 corresponds to the second E-core 360 of FIGS. 2 and 3.

Figure 21:
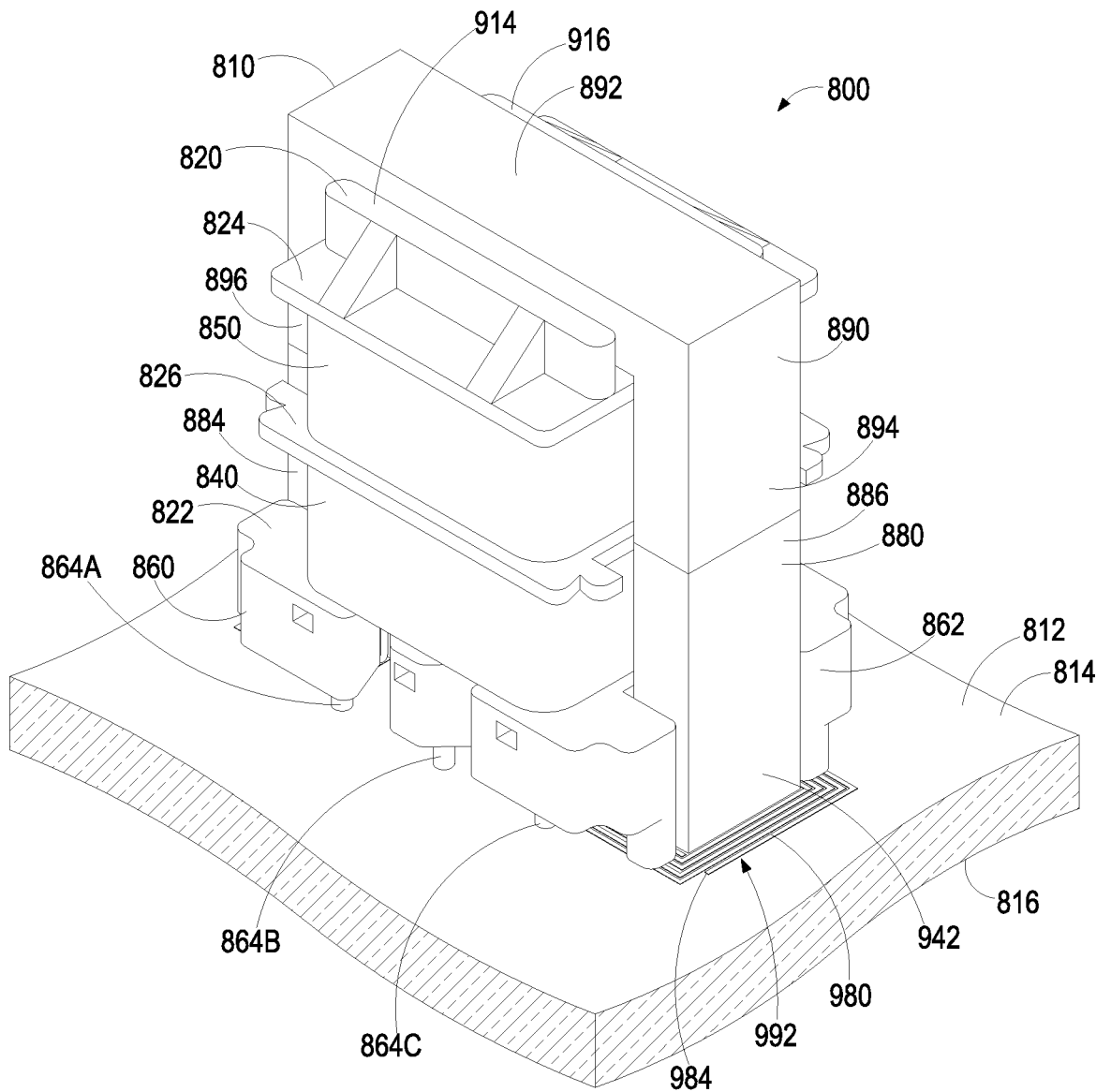
FIG. 21 illustrates a perspective view of a common-mode choke with integrated RF inductors in accordance with a third embodiment in which the integrated RF inductors are formed on protrusions extending vertically from the body portion of at least one E-core, which is oriented perpendicularly to the surface of a PCB.

When the common-mode choke portion 810 is mounted to the PCB 812 as illustrated in FIG. 21, the first protrusion 940 is inserted into the first rectangular opening 960 and the second protrusion 942 is inserted into the second rectangular opening 962. The first printed wiring winding 970 surrounds the first protrusion to form a first integrated RF inductor 990 represented schematically in FIGS. 28 and 29. Similarly, the second printed wiring winding 980 surrounds the second protrusion to form a second integrated RF inductor 992 shown in FIGS. 21 and represented schematically in FIGS. 28 and 29. Accordingly, the completed installation of the common-mode choke onto the PCB completes the structure of the common-mode choke with integrated RF inductors 800.

Figure 22:
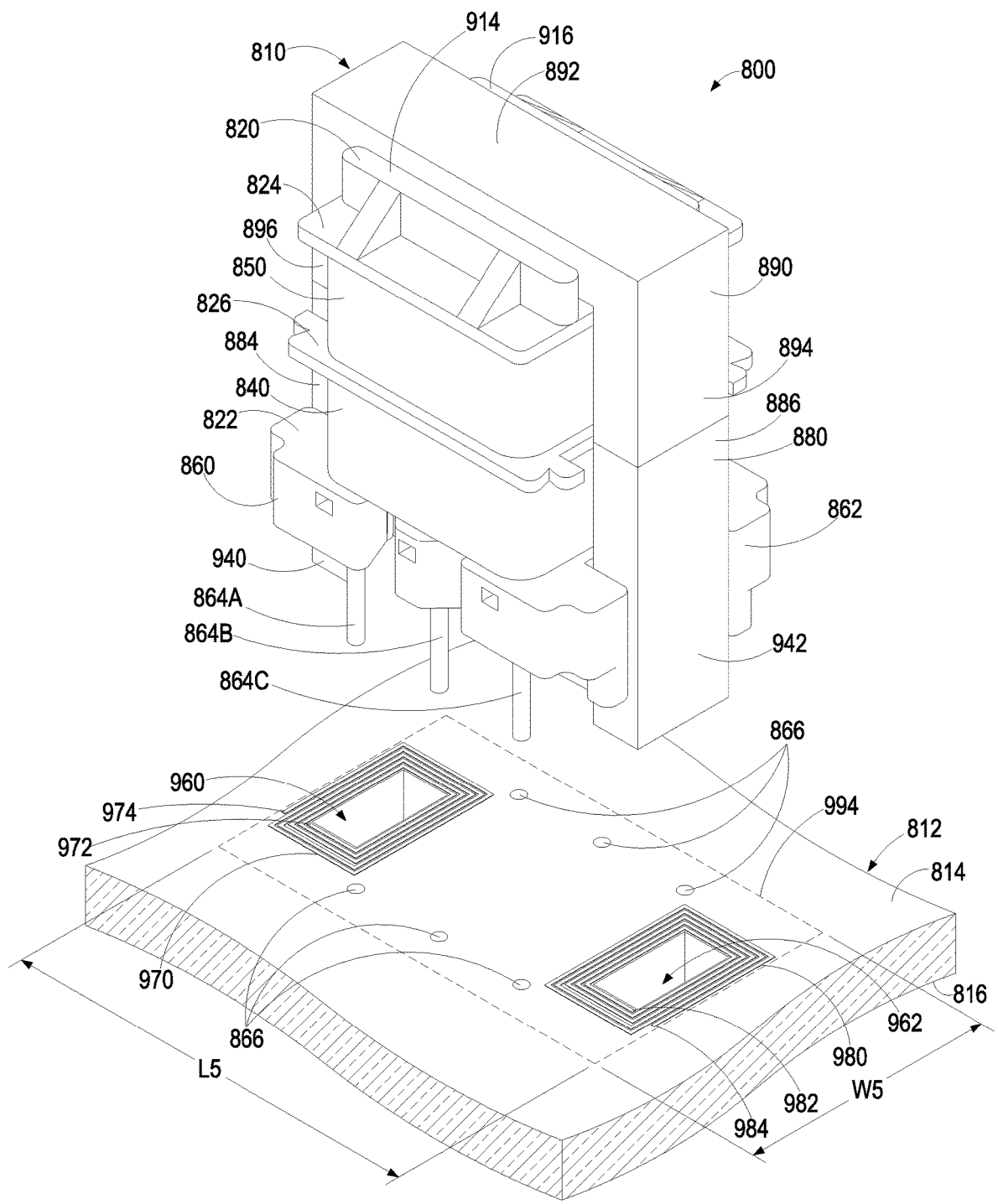
FIG. 22 illustrates a perspective view of the common-mode choke with integrated RF inductors of FIG. 21 in position to engage the PCB, the view showing the printed circuit windings that are positioned to surround the vertical protrusions of the E-core.
Figures 23, 24, 25:
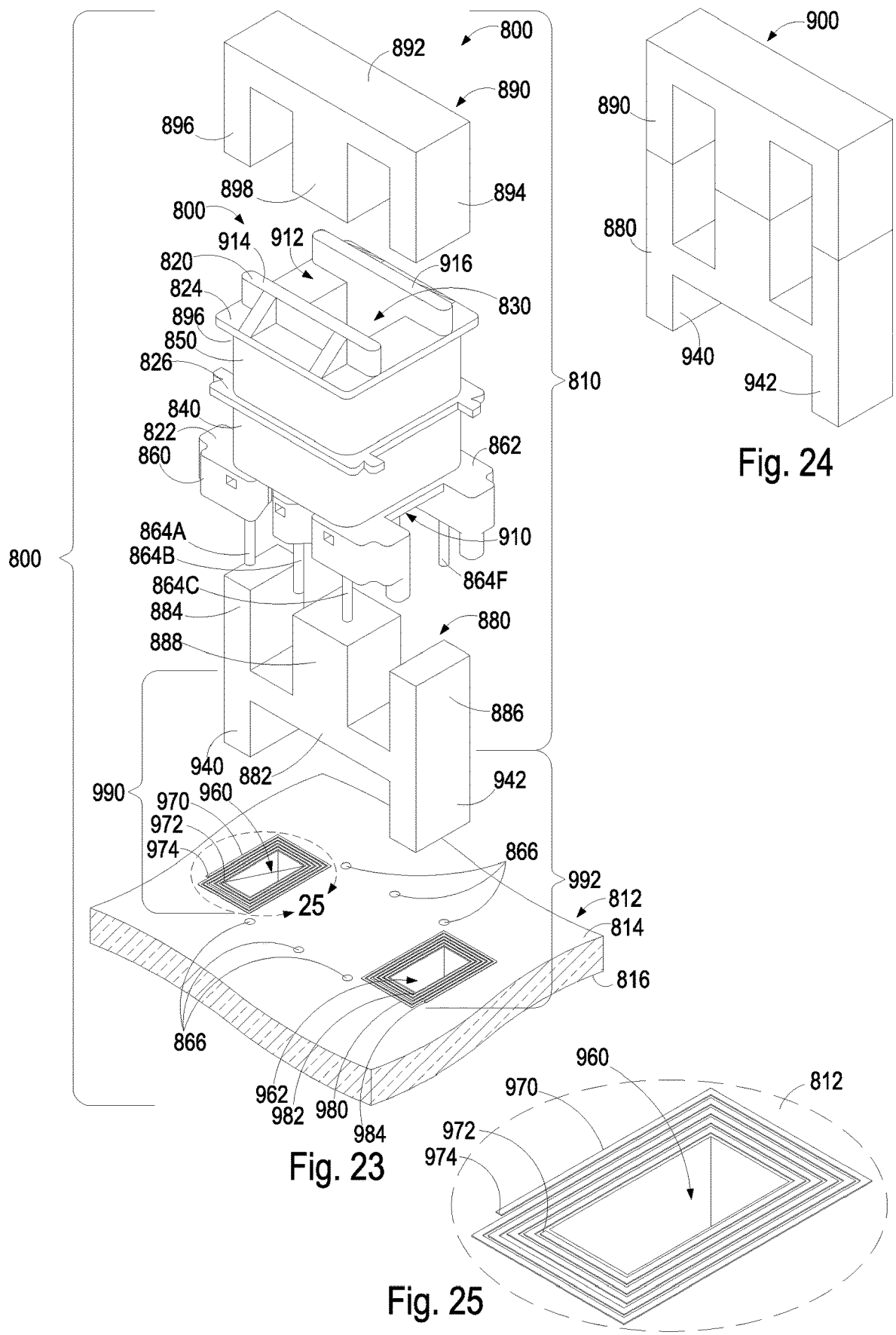
FIG. 23 illustrates an exploded perspective view of the common-mode choke with integrated RF inductors and the PCB of FIG. 22.
FIG. 24 illustrates a perspective view of the first E-core and the second E-core of FIGS. 21-23 with the end surfaces of the legs of the two E-cores abutting to form a combined EE core structure.
FIG. 25 illustrates an enlarged perspective view of one of the printed circuit windings of FIG. 23, the view taken within the area —25—of FIG. 23.
Figure 26:
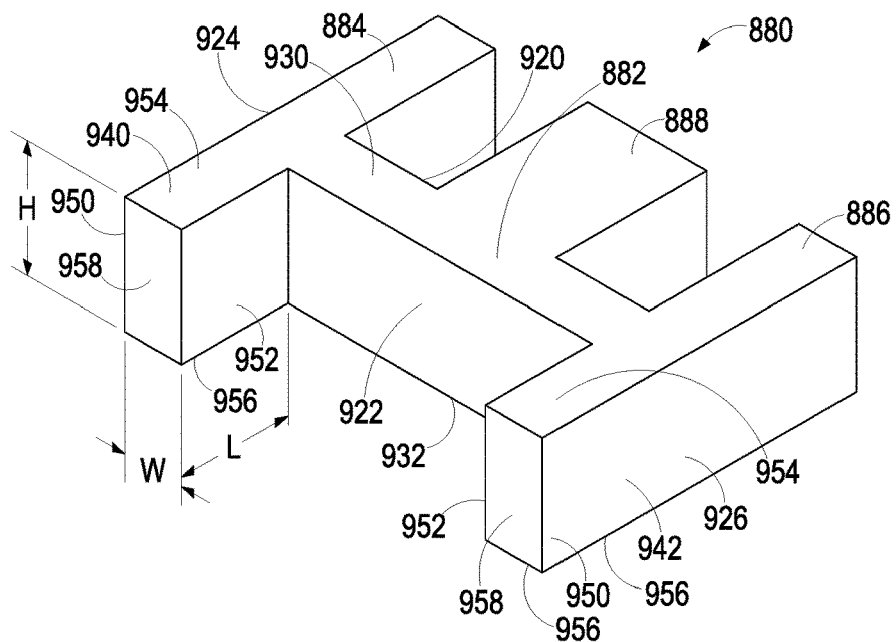
FIG. 26 illustrates the lower E-core with protrusions of FIGS. 21-25, the E-core rotated to a horizontal orientation to show the lower surfaces of the E-core.
Figure 27:
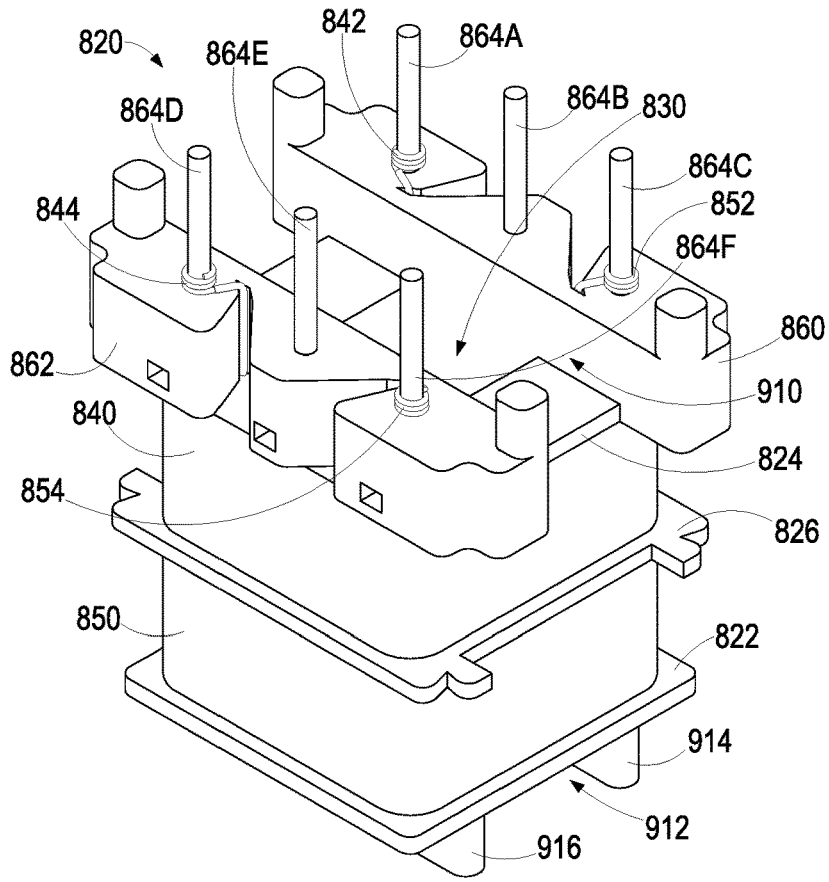
FIG. 27 illustrates the bobbin and the coil windings of the common-mode choke with integrated RF inductors of FIGS. 21-25 prior to the installation of the two E-cores, the bobbin rotated about an axis to the lower surfaces of the bobbin.

As illustrated in FIG. 22, the common-mode choke with integrated RF inductors 800 occupies a generally rectangular portion 994 of the surface 814 of the PCB 812 having a length L5 of approximately 0.9 inch and a width W5 of approximately 0.55 inch. The area of the occupied portion is approximately 0.495 square inch, which is approximately 52 percent of the total area of the combined areas 380, 386 of FIG. 1.

Figure 28:
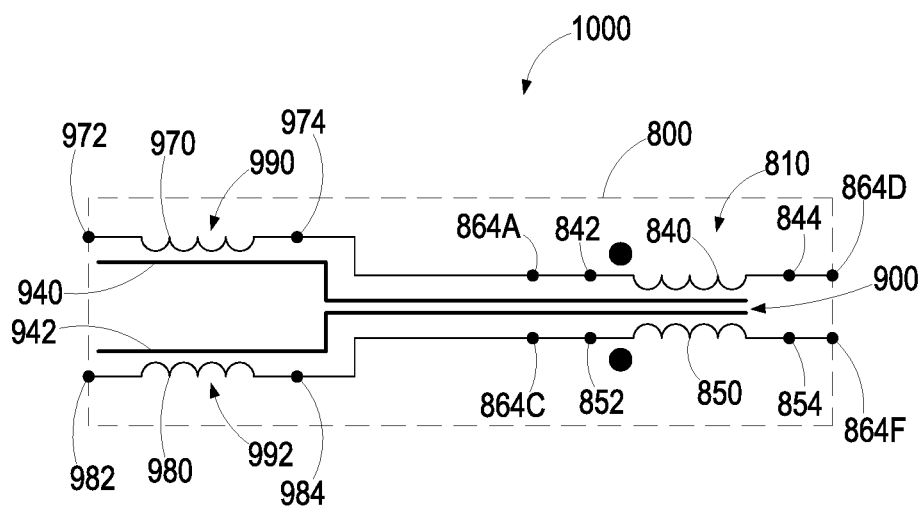
FIG. 28 illustrates a schematic circuit diagram of the common-mode choke with integrated RF inductors of FIGS. 21-27.

The common-mode choke with integrated RF inductors 800 shown in FIGS. 21-27 is represented by a schematic circuit diagram 1000 in FIG. 28. As described above, the common-mode choke portion 810 of the common-mode choke with integrated RF inductors is formed by the first winding 840 and the second winding 850 on the EE core 900. The first integrated RF inductor 990 and the second integrated RF inductor 992 of the common-mode choke with integrated RF inductors are formed on the first protrusion 940 and the second protrusion 942, respectively, of the EE core 900. Except for the changes in element identifiers, the schematic circuit diagram 1000 of the of the common-mode choke with integrated RF inductors in FIG. 28 corresponds to the schematic circuit diagram 580 of the common-mode choke with integrated RF inductors 400 of FIG. 10.

As shown in FIG. 28, the first winding end 972 of the first printed circuit winding 970 is the first terminal of the first integrated RF inductor 990. The first winding end 982 of the second printed circuit winding 980 is the first terminal of the second integrated RF inductor 992. The first winding ends of the first and second integrated RF inductors are connected as described below with respect to FIG. 29. The second winding end 974 of the first printed circuit winding is the second terminal of the first integrated RF inductor and is electrically connected via printed wiring on the PCB to the first pin 864A and is thereby connected to the first winding end 842 of the first winding 840 of the common-mode choke portion 810 of the common-mode choke with integrated RF inductors 800. The second winding end 984 of the second printed circuit winding is the second terminal of the second integrated RF inductor and is electrically connected via printed wiring on the PCB to the third pin 864C and is thereby connected to the first winding end 852 of the second winding 850 of the common-mode choke portion. The second end 844 of the first winding of the common-mode choke portion is connected to the fourth pin 864D. The second end 854 of the second winding of the common-mode choke portion is connected to the sixth pin 864F.

Figure 29:
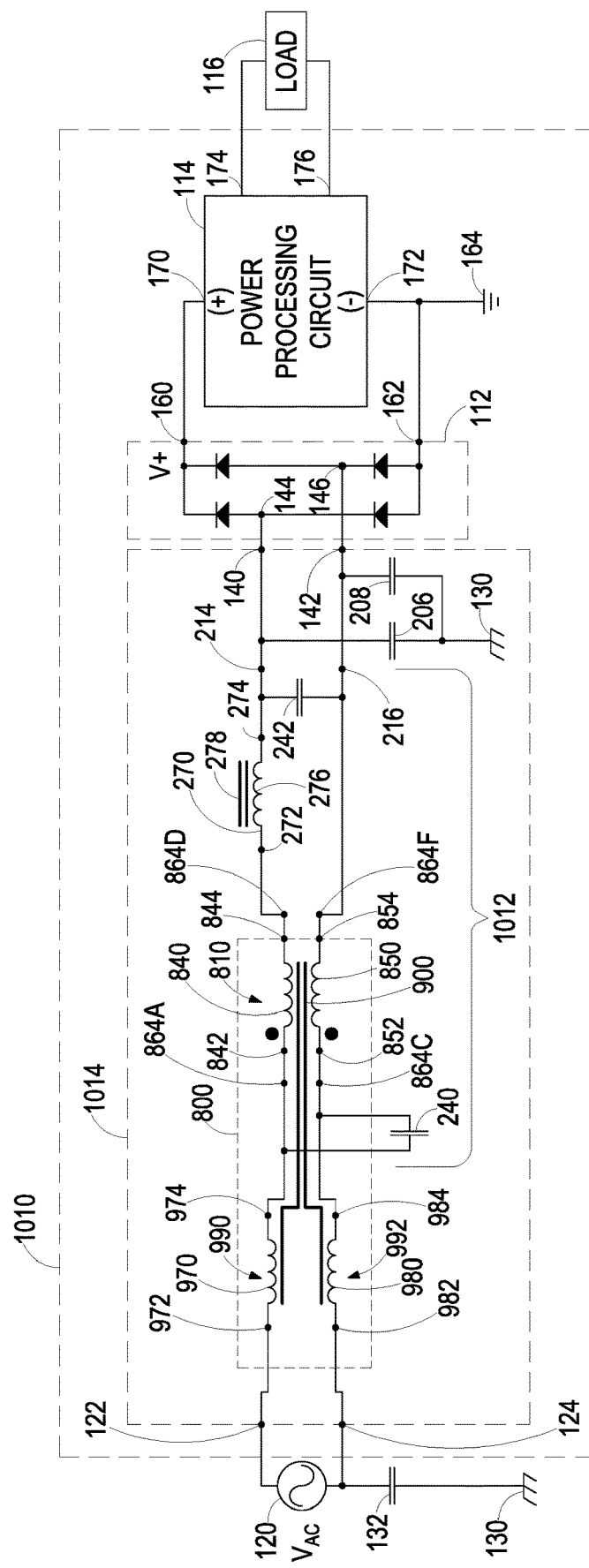
FIG. 29 illustrates a schematic circuit diagram of an electronic switching power supply similar to the electronic power supply of FIG. 1 with the common-mode choke with integrated RF inductors of FIGS. 21-27 replacing the common-mode choke and the discrete RF inductors of FIG. 1.

FIG. 29 illustrates a schematic circuit diagram of a switching power supply 1010 that incorporates the common-mode choke with integrated RF inductors 800 of FIGS. 21-27 into a pi-type filter 1012 in an EMI control circuit 1014, which corresponds electrically to the EMI control circuit 110 of FIG. 1. The components in the EMI control circuit of FIG. 28, other than the components in the common-mode choke with integrated RF inductors and the respective interconnection terminals and pins, are numbered as described above with respect to the EMI control circuit of FIG. 1. The other components in the switching power supply of FIG. 29 correspond to the components in the conventional electronic switching power supply 100 of FIG. 1 and are numbered accordingly.

The first winding end 972 of the first printed circuit winding 970 is electrically connected to the first (line) input terminal 122 of the EMI control circuit 1014. The first winding end 982 of the second printed circuit winding 980 is electrically connected to the second (neutral) input terminal 124 of the EMI control circuit. The second winding end 974 of the first printed circuit winding is electrically connected to the first winding end 842 of the first winding 840 of the common-mode choke portion 810 via the first pin 864A. The second winding end of the first printed circuit winding is also connected to the first terminal of the first X-type capacitor 240. The second winding end 984 of the second printed circuit winding is electrically connected to the first winding end 852 of the second winding 850 of the common-mode choke portion via the third pin 864C. The second winding end of the second printed circuit winding is also connected to the second terminal of the first X-type capacitor. The second winding end 844 of the first winding of the common-mode choke portion is electrically connected to the first terminal 272 of the differential-mode choke 270 via the fourth pin 864D. The second winding end 854 of the second winding of the common-mode choke portion is electrically connected to the second terminal of the second X-type capacitor 242 and to the second filter output node 216 via the sixth pin 864F.

Although the physical structures of the first integrated RF inductor 990 and the second integrated RF inductor 992 of FIGS. 21-27 differ from structures of the first integrated RF inductor 530 and the second integrated RF inductor 550 described in FIGS. 5-9, the electrical characteristics are similar. Accordingly, the switching power supply 1010 of FIG. 29 operates as previously described for the electronic switching power supply 586 of FIG. 11.

The embodiment of FIGS. 21-27 provides a reduction in the measured emission levels comparable to the reduction illustrated in FIGS. 12 and 13 for the embodiment of FIGS. 5-9.

In each of the embodiments disclosed herein, the core structure of the common-mode choke is illustrated as an EE core comprising two E-cores mounted in a bobbin with the end surfaces of the middle legs abutting within the core-receiving passageway of the bobbin. It should be appreciated that the EE core structure can be replaced with other structures. For example, an E-I core structure has a single E-core with a middle leg that extends through the core-receiving passageway from a first end of the bobbin to a second end of the bobbin. The E-I core structure has an I-core (e.g., an I-bar) that interconnects the three legs of the E-core at the second end of the bobbin. The protrusions disclosed herein may extend from the single E-core or may extend from the I-core.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A common-mode choke with integrated radio frequency (RF) inductors, the common-mode choke with integrated RF inductors comprising:
   a bobbin having a core-receiving passageway, a first choke winding and a second choke winding, each of the first and second choke windings wound around the core-receiving passageway;
   a first E-core and a second E-core, each E-core comprising a body portion, a first outer leg, a second outer leg and a middle leg, the middle leg of the first E-core inserted into a first end of the core-receiving passageway, the middle leg of the second E-core inserted into a second end of the core-receiving passageway, wherein at least the first E-core comprises:
      the respective body portion comprising a rectangular parallelepiped having an inner surface, an outer surface, a first side surface, a second side surface, a first lateral surface and a second lateral surface;
      the first outer leg extending perpendicularly from the inner surface of the body portion at the first side surface;
      the second outer leg extending perpendicularly from the inner surface of the body portion at the second side surface;
      the middle leg extending perpendicularly from the inner surface of the body portion at a location between the first outer leg and the second outer leg;
      a first protrusion extending from a selected surface of the body portion other than the inner surface, the first protrusion located near the first side surface; and
      a second protrusion extending from the selected surface of the body portion, the second protrusion located near the second side surface;
   a first RF inductor winding positioned around the first protrusion to form a first integrated RF inductor; and
   a second RF inductor winding positioned around the second protrusion to form a second integrated RF inductor.

2. The common-mode choke with integrated RF inductors as defined in claim 1, wherein the selected surface of the body portion of the first E-core is the first lateral surface.

3. The common-mode choke with integrated RF inductors as defined in claim 1, wherein the selected surface of the body portion of the first E-core is the outer surface.

4. The common-mode choke with integrated RF inductors as defined in claim 3, wherein:
   each of the first protrusion and the second protrusion of the first E-core has a respective lateral surface parallel to the first lateral surface of the body portion;
   each of the first protrusion and the second protrusion of the first E-core includes a respective wire-receiving channel extending into the protrusion from the respective lateral surface of the protrusion;
   at least a portion of the first RF inductor winding positioned around the first protrusion is positioned in the respective wire-receiving channel of the first protrusion; and
   at least a portion of the second RF inductor winding positioned around the second protrusion is positioned in the respective wire-receiving channel of the second protrusion.

5. The common-mode choke with integrated RF inductors as defined in claim 3, further comprising a printed circuit board (PCB), the PCB having an upper surface and a lower surface, the PCB comprising:
   a first opening extending through the PCB from the upper surface to the lower surface, the first opening configured to receive the first protrusion of the first E-core;
   a second opening extending through the PCB from the upper surface to the lower surface, the second opening configured to receive the second protrusion of the first E-core;
   the first RF inductor winding formed on at least one of the first surface or the second surface of the PCB as a first printed wiring winding surrounding the first opening; and
   the second RF inductor winding formed on at least one of the first surface or the second surface of the PCB as a second printed wiring winding surrounding the second opening.

* * * * *